United States Patent
Chae et al.

(10) Patent No.: US 12,543,330 B2
(45) Date of Patent: Feb. 3, 2026

(54) SEMICONDUCTOR DEVICE

(71) Applicant: SAMSUNG ELECTRONICS CO., LTD., Suwon-si (KR)

(72) Inventors: Hong Sik Chae, Suwon-si (KR); Tae Kyun Kim, Suwon-si (KR); Ji Hoon An, Suwon-si (KR); Hyun-Suk Lee, Suwon-si (KR); Gi Hee Cho, Suwon-si (KR); Jae Hyoung Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 411 days.

(21) Appl. No.: 18/119,896

(22) Filed: Mar. 10, 2023

(65) Prior Publication Data

US 2024/0014252 A1    Jan. 11, 2024

(30) Foreign Application Priority Data

Jul. 5, 2022  (KR) .................. 10-2022-0082354

(51) Int. Cl.
| | |
|---|---|
| *H10D 1/68* | (2025.01) |
| *H10B 12/00* | (2023.01) |
| *H10D 1/00* | (2025.01) |

(52) U.S. Cl.
CPC ............ *H10D 1/696* (2025.01); *H10B 12/00* (2023.02); *H10B 12/033* (2023.02); *H10B 12/315* (2023.02); *H10D 1/042* (2025.01); *H10D 1/714* (2025.01); *H10D 1/716* (2025.01)

(58) Field of Classification Search
CPC .. H10B 12/033; H10B 12/315; H10B 12/043; H10D 1/716; H10D 1/696
See application file for complete search history.

(56) References Cited

U.S. PATENT DOCUMENTS

| | | |
|---|---|---|
| 8,723,244 B2 | 5/2014 | Miyajima |
| 9,601,494 B2 | 3/2017 | Kim et al. |
| 9,935,110 B2 | 4/2018 | Rhie |
| | (Continued) | |

FOREIGN PATENT DOCUMENTS

TW    202205629 A    2/2022

OTHER PUBLICATIONS

First Office Action dated Feb. 19, 2024 for corresponding application No. TW 112116689.

*Primary Examiner* — Jose R Diaz
(74) *Attorney, Agent, or Firm* — Muir Patent Law, PLLC

(57) ABSTRACT

A semiconductor device includes a substrate, first and second supporter patterns spaced vertically from the substrate, the second supporter pattern being spaced vertically from the first supporter pattern, a lower electrode hole extending vertically on the substrate, a lower electrode inside the lower electrode hole, contacting a sidewall of the first and second supporter patterns, the lower electrode including a first layer along a portion of a sidewall and bottom surface of the lower electrode hole, a second layer between the first layers, and a third layer on an upper surface of the first and second layers, the first and second layers including a material different from the second layer, and a sidewall of at least a portion of the third layer being concave toward the third layer, overlapping the second layer in the vertical direction, and being spaced apart from the second layer in the vertical direction.

20 Claims, 28 Drawing Sheets

(56) References Cited

U.S. PATENT DOCUMENTS

| | | |
|---|---|---|
| 10,580,777 B2 | 3/2020 | Lee et al. |
| 10,971,496 B2 | 4/2021 | Kim et al. |
| 10,985,238 B2 | 4/2021 | Kim |
| 11,011,523 B2 | 5/2021 | Shreeram et al. |
| 11,925,031 B2 * | 3/2024 | Simsek-Ege ........... H10B 53/30 |
| 2012/0098092 A1 | 4/2012 | Park et al. |
| 2019/0333985 A1* | 10/2019 | Lee ...................... H10B 12/312 |
| 2020/0203148 A1* | 6/2020 | Kim ................. H01L 21/31144 |
| 2022/0059540 A1 | 2/2022 | Zhao |

* cited by examiner

SEMICONDUCTOR DEVICE

CROSS-REFERENCE TO RELATED APPLICATION

This application claims priority from Korean Patent Application No. 10-2022-0082354 filed on Jul. 5, 2022 in the Korean Intellectual Property Office and all the benefits accruing therefrom under 35 U.S.C. 119, the contents of which in its entirety are herein incorporated by reference.

BACKGROUND

1. Field

The present disclosure relates to a semiconductor device.

2. Description of the Related Art

A Buried Channel Array Transistor (BCAT) may include a gate electrode buried in a trench to overcome a short channel effect of a DRAM structure.

As semiconductor devices become increasingly highly integrated, individual circuit patterns are beginning to take the form of fine patterns in order to provide more semiconductor devices in the same area. That is, design rules for components of a semiconductor device are decreasing. As DRAM devices are also integrated, the amount of charging in a capacitor has been steadily decreasing. Therefore, studies for increasing the amount of charge stored in a capacitor and attenuating leakage characteristics are ongoing.

SUMMARY

Embodiments are directed to a semiconductor device comprising: a substrate; a first supporter pattern spaced apart from the substrate in a vertical direction; a second supporter pattern spaced apart from the first supporter pattern in the vertical direction; a lower electrode hole extended in the vertical direction on the substrate; and a lower electrode inside the lower electrode hole, the lower electrode being in contact with each of a sidewall of the first supporter pattern and a sidewall of the second supporter pattern, the lower electrode including a first layer disposed along a portion of a sidewall and a bottom surface of the lower electrode hole, a second layer between the first layers, and a third layer on an upper surface of each of the first and second layers, wherein each of the first layer and the third layer includes a material different from the second layer, and a sidewall of at least a portion of the third layer is formed to be concave toward the third layer, overlaps the second layer in the vertical direction, and is spaced apart from the second layer in the vertical direction.

An object of the present disclosure is to provide a semiconductor device in which a lower electrode includes a plurality of layers including a lower layer having an inner layer and an outer layer and an upper layer on the lower layer. A height of the lower layer may be adjusted when an open region is formed between a plurality of lower electrodes, such that the inner layer of the lower layer is prevented from being etched to prevent the outer layer of the lower layer from being inclined so as not to be in contact with another lower electrode.

According to some embodiments of the present disclosure, there is provided a semiconductor device, comprising a substrate, a first supporter pattern spaced apart from the substrate in a vertical direction, a second supporter pattern spaced apart from the first supporter pattern in the vertical direction, a lower electrode hole extended in the vertical direction on the substrate, and a lower electrode inside the lower electrode hole, being in contact with each of a sidewall of the first supporter pattern and a sidewall of the second supporter pattern, the lower electrode includes a first layer disposed along a portion of a sidewall and a bottom surface of the lower electrode hole, a second layer located between the first layers, and a third layer located on an upper surface of each of the first and second layers, wherein each of the first layer and the third layer includes a material different from the second layer, and wherein a sidewall of at least a portion of the third layer is formed to be concave toward the third layer, overlaps the second layer in the vertical direction, and is spaced apart from the second layer in the vertical direction.

According to some embodiments of the present disclosure, there is provided a semiconductor device, comprising a substrate, a first supporter pattern spaced apart from the substrate in a vertical direction, a second supporter pattern spaced apart from the first supporter pattern in the vertical direction, a lower electrode hole extended in the vertical direction on the substrate, and a lower electrode inside the lower electrode hole, being in contact with each of a sidewall of the first supporter pattern and a sidewall of the second supporter pattern, the lower electrode includes a first layer disposed along a portion of a sidewall and a bottom surface of the lower electrode hole, a second layer located between the first layers, and a third layer located on an upper surface of each of the first and second layers, wherein each of the first layer and the third layer includes a material different from the second layer, and wherein the third layer includes, a first portion being in contact with each of the upper surface of the first layer and the upper surface of the second layer, a width in a horizontal direction of the first portion is the same as a width in the horizontal direction between outer walls of the first layer, and a second portion on the first portion and spaced apart from each of the upper surface of the first layer and the upper surface of the second layer in the vertical direction, a width in the horizontal direction of the second portion continuously increases as it becomes more adjacent to the first portion.

According to some embodiments of the present disclosure, there is provided a semiconductor device, comprising a substrate, a first supporter pattern spaced apart from the substrate in a vertical direction, a second supporter pattern spaced apart from the first supporter pattern in the vertical direction, a first lower electrode hole extended in the vertical direction on the substrate, a second lower electrode hole extended in the vertical direction on the substrate and spaced apart from the first lower electrode hole in a horizontal direction, an open region passing through each of the first and second supporter patterns in the vertical direction between the first lower electrode hole and the second lower electrode hole, a first lower electrode located inside the first lower electrode hole, being in contact with each of a sidewall of the first supporter pattern and a sidewall of the second supporter pattern, the first lower electrode includes a first layer disposed along a portion of a sidewall and a bottom surface of the first lower electrode hole, a second layer located between the first layers, and a third layer located on an upper surface of each of the first and second layers, a second lower electrode located inside the second lower electrode hole, and an upper electrode at least partially overlapped with the second layer in the vertical direction inside the open region, wherein each of the first layer and the third layer includes a material different from the second layer, and wherein a lower surface of at least a portion of the upper electrode overlapped with the second layer in the vertical direction is formed to be higher than the upper surface of the second layer.

The objects of the present disclosure mentioned above and additional objects of the present disclosure will be clearly understood by those skilled in the art from the following description of the present disclosure.

BRIEF DESCRIPTION OF THE DRAWINGS

Features will become apparent to those of skill in the art by describing in detail exemplary embodiments with reference to the attached drawings in which.

DETAILED DESCRIPTION

Hereinafter, a semiconductor device according to some embodiments of the present disclosure will be described with reference to FIGS. 1 to 4.

Figure 1:
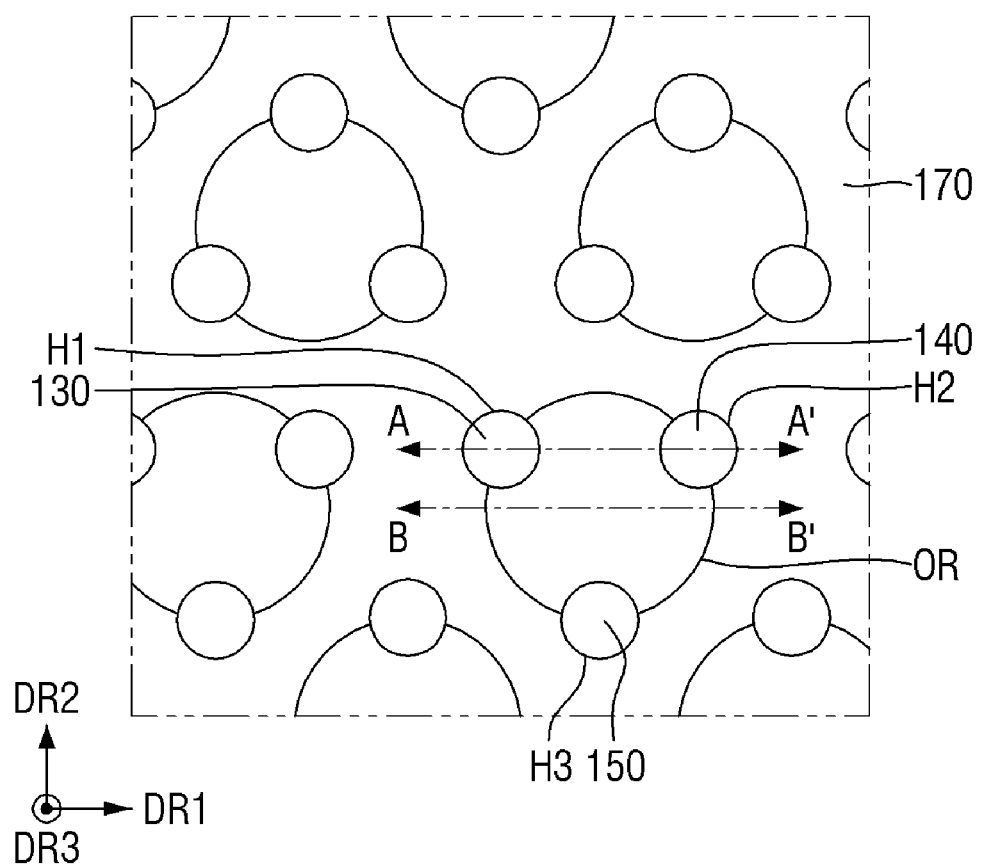
FIG. 1 is a plan view illustrating a semiconductor device according to some embodiments of the present disclosure.
Figure 2:
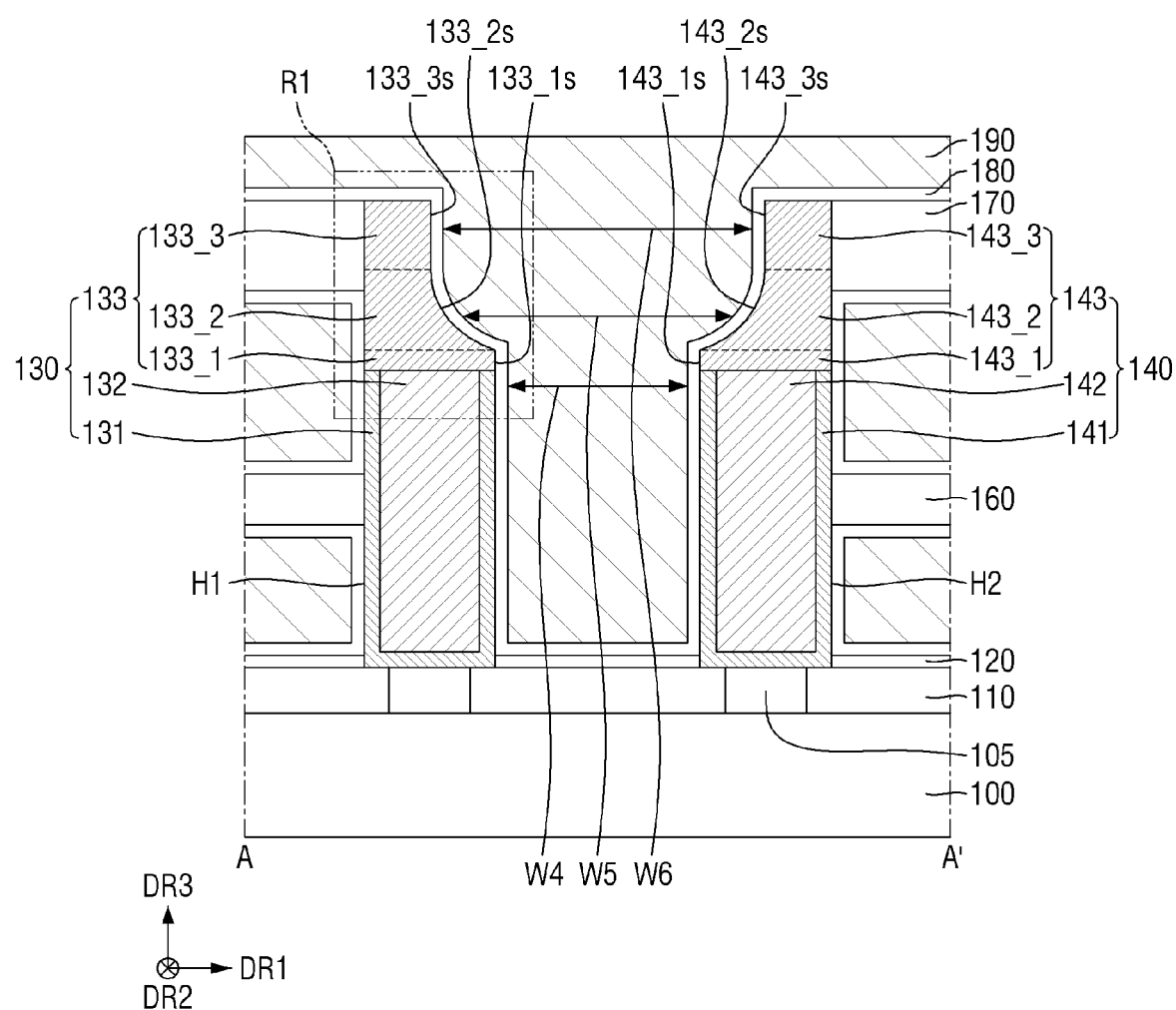
FIG. 2 is a cross-sectional view taken along line A-A' of FIG. 1.
Figure 3:
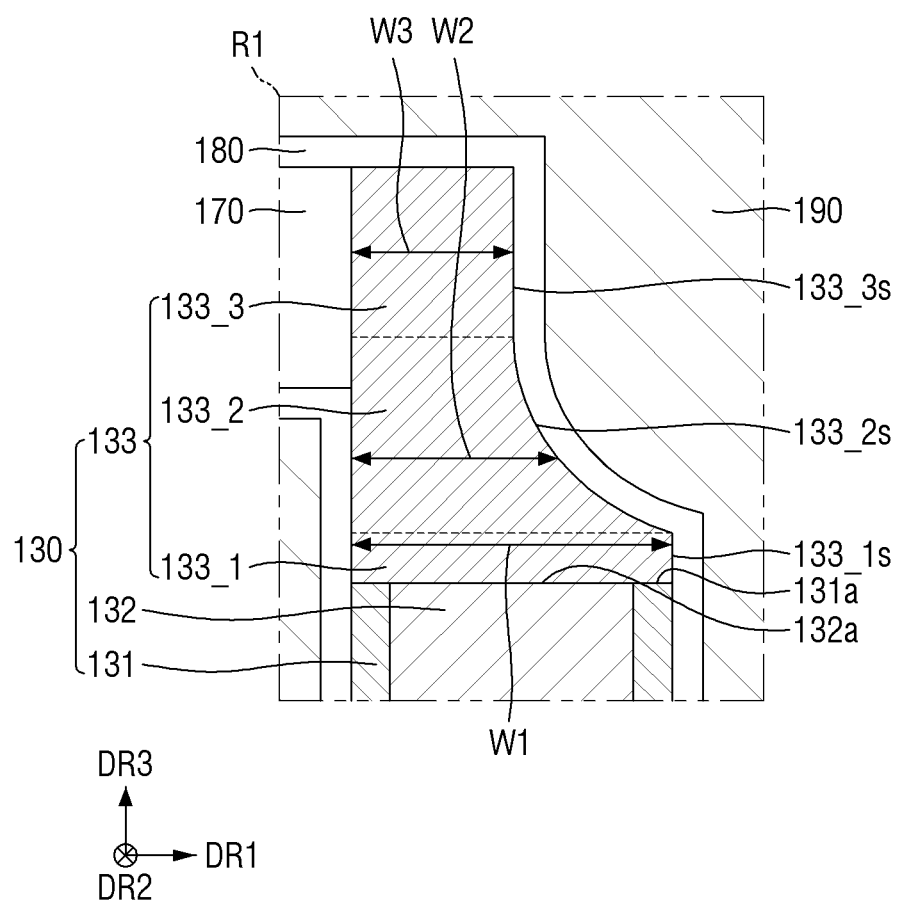
FIG. 3 is an enlarged view illustrating a region R1 of FIG. 2.
Figure 4:
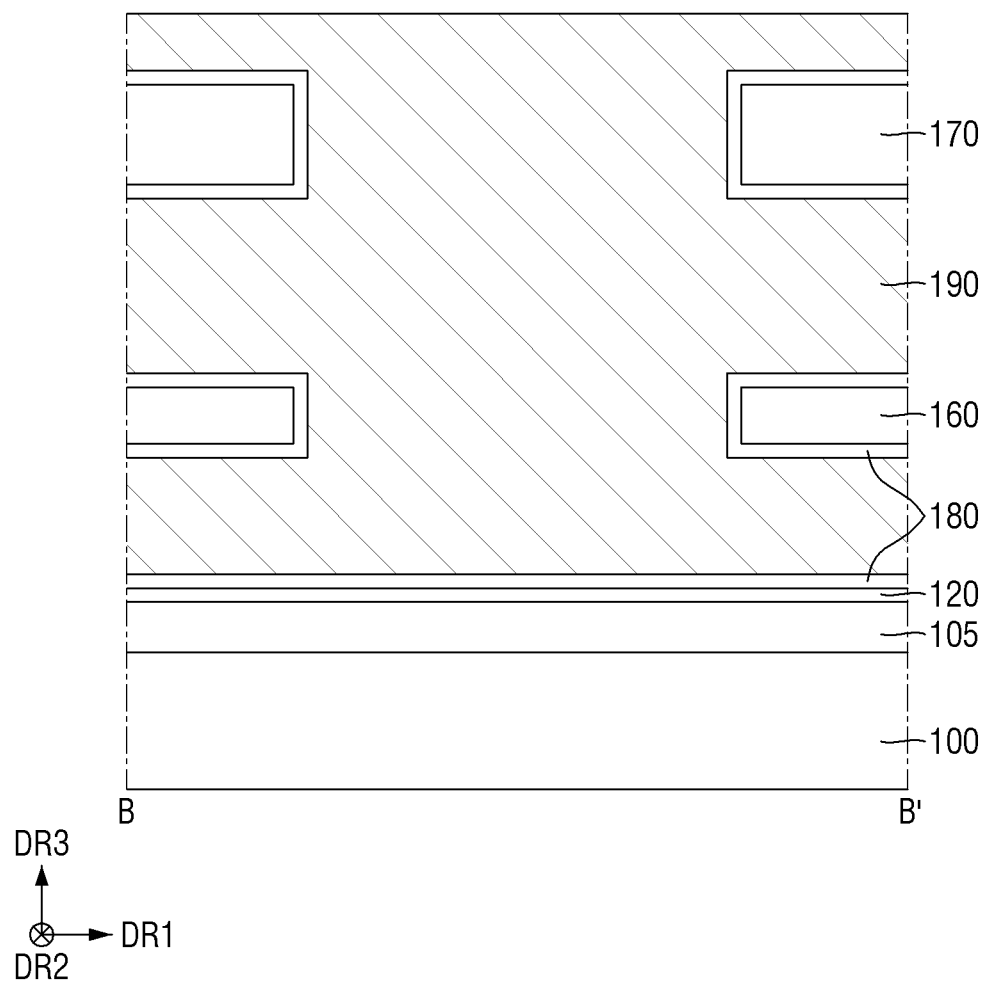
FIG. 4 is a cross-sectional view taken along line B-B' of FIG. 1.

FIG. 1 is a plan view illustrating a semiconductor device according to some embodiments of the present disclosure. FIG. 2 is a cross-sectional view taken along line A-A' of FIG. 1. FIG. 3 is an enlarged view illustrating a region R1 of FIG. 2. FIG. 4 is a cross-sectional view taken along line B-B' of FIG. 1.

Referring to FIGS. 1 to 4, a semiconductor device according to some embodiments of the present disclosure includes a substrate 100, a contact plug 105, an interlayer insulating layer 110, an etch stop layer 120, a first lower electrode 130, a second lower electrode 140, a third lower electrode 150, a first supporter pattern 160, a second supporter pattern 170, a capacitor dielectric layer 180, and an upper electrode 190.

The substrate 100 may be bulk silicon or silicon-on-insulator (SOI). In some implementations, the substrate 100 may be a silicon substrate, or may include other materials such as silicon germanium, silicon germanium on insulator (SGOI), indium antimonide, lead telluride compound, indium arsenide, indium phosphide, gallium arsenide or gallium antimonide. The following description will be based on considering the substrate 100 to be or to include a silicon substrate.

In an implementation, a word line and a bit line may be located inside the substrate 100. A unit active region and a device isolation region may be formed in the substrate 100. In an implementation, two transistors may be formed in one unit active region.

Hereinafter, each of a first horizontal direction DR1 and a second horizontal direction DR2 is defined as a direction parallel with an upper surface of the substrate 100, and the second horizontal direction DR2 is defined as a direction perpendicular to the first horizontal direction DR1. In addition, a vertical direction DR3 is perpendicular to each of the first and second horizontal directions DR1 and DR2, and is defined as a direction perpendicular to the upper surface of the substrate 100.

The interlayer insulating layer 110 may be on the substrate 100. The interlayer insulating layer 110 may include silicon oxide ($SiO_2$), silicon nitride (SiN), silicon oxynitride (SiON), or a low dielectric constant material. In an implementation, the interlayer insulating layer 110 may be a single layer or a multi-layer. As used herein, the term "or" is not an exclusive term, e.g., "A or B" would include A, B, or A and B.

The contact plug 105 may be inside the interlayer insulating layer 110. The contact plug 105 may pass through the interlayer insulating layer 110 in the vertical direction DR3. The contact plug 105 may be electrically connected to a source/drain region formed in the substrate 100.

The contact plug 105 may include a conductive material. The contact plug 105 may include, e.g., polycrystalline silicon, a metal silicide compound, a conductive metal nitride, or a metal.

The etch stop layer 120 may be on the interlayer insulating layer 110. The etch stop layer 120 may include a material having an etch selectivity with respect to a first mold layer (10 of FIG. 5) and a second mold layer (20 of FIG. 5), which contain oxide. The etch stop layer 120 may include, e.g., silicon nitride (SiN), silicon carbonitride (SiCN), silicon boron nitride (SiBN), silicon carbon oxide (SiCO), silicon oxynitride (SiON), silicon oxide (SiO), or silicon oxycarbonitride (SiOCN).

The first supporter pattern 160 may be on the etch stop layer 120, spaced apart from the etch stop layer 120 in the vertical direction DR3. The second supporter pattern 170 may be on the first supporter pattern 160, spaced apart from the first supporter pattern 160 in the vertical direction DR3. Each of the first supporter pattern 160 and the second supporter pattern 170 may be in contact with sidewalls of each of a plurality of the lower electrodes 130, 140, and 150, as will be described below. In an implementation, a thickness of the second supporter pattern 170 in the vertical direction DR3 may be greater than the thickness of the first supporter pattern 160 in the vertical direction DR3.

Each of the first supporter pattern 160 and the second supporter pattern 170 may include, e.g., silicon oxynitride (SiON), silicon nitride (SiN), silicon carbon nitride (SiCN), or tantalum oxide (TaO). In an implementation, the first supporter pattern 160 and the second supporter pattern 170 may include the same material. In an implementation, the first supporter pattern 160 and the second supporter pattern 170 may include respective materials that are different from each other.

A plurality of lower electrode holes that are spaced apart from each other may be formed on the substrate 100. Each of the plurality of lower electrode holes may extend in the vertical direction DR3 on the contact plug 105. In an implementation, a first lower electrode hole H1, a second lower electrode hole H2 and a third lower electrode hole H3 may be formed to be spaced apart from one another on the contact plug 105. Implementation, the second lower electrode hole H2 may be spaced apart from the first lower electrode hole H1 in the first horizontal direction DR1.

In an implementation, the centers of the first lower electrode hole H1, the second lower electrode hole H2 and the third lower electrode hole H3 may be spaced apart from one another at the same interval and arranged in a triangular shape. Each of the first lower electrode hole H1, the second lower electrode hole H2 and the third lower electrode hole H3 may be extended from an upper surface of the contact plug 105 to an upper surface of the second supporter pattern 170 in the vertical direction DR3.

An open region OR may be formed among the first to third lower electrode holes H1, H2 and H3. The open region OR may pass through the first supporter pattern 160 and the second supporter pattern 170 in the vertical direction DR3. A bottom surface of the open region OR may be defined as an upper surface of the etch stop layer 120. In an implementation, on a plane defined by the first and second horizontal directions DR1 and DR2, a planar shape of the open region OR may have a circular shape connecting the first to third lower electrode holes H1, H2 and H3.

The first lower electrode 130 may be inside the first lower electrode hole H1. In an implementation, the first lower electrode 130 may completely fill the inside of the first lower electrode hole H1 on the contact plug 105. In an implementation, the first lower electrode 130 may have a pillar shape. The first lower electrode 130 may be extended in the vertical direction DR3 by passing through the etch stop layer 120 on the contact plug 105. The first lower electrode 130 may be electrically connected to the contact plug 105. The first lower electrode 130 may be in contact with each of a sidewall of the first supporter pattern 160 and a sidewall of the second supporter pattern 170. In an implementation, the uppermost surface of the first lower electrode 130 may be formed on the same plane as the upper surface of the second supporter pattern 170.

The first lower electrode 130 may include a first layer 131, a second layer 132, and a third layer 133. The first layer 131 of the first lower electrode 130 may be located along a portion of a sidewall and a bottom surface of the first lower electrode hole H1. The first layer 131 of the first lower electrode 130 may be in contact with the contact plug 105. In an implementation, the first layer 131 of the first lower electrode 130 may be conformal. In an implementation, an upper surface 131a of the first layer 131 of the first lower electrode 130 may be formed between the first supporter pattern 160 and the second supporter pattern 170. In an implementation, the upper surface 131a of the first layer 131 of the first lower electrode 130 may be formed between an upper surface of the first supporter pattern 160 and a lower surface of the second supporter pattern 170.

The first layer 131 of the first lower electrode 130 may include a metal nitride. In an implementation, the first layer 131 of the first lower electrode 130 may include titanium nitride (TiN). In an implementation, the first layer 131 of the first lower electrode 130 may include molybdenum nitride (MoN), tantalum nitride (TaN), ruthenium nitride (RuN), niobium nitride (NbN), tungsten nitride (WN), metal (e.g., ruthenium (Ru), iridium (Ir), titanium (Ti), tantalum (Ta), or niobium (Nb)) or a metal oxide.

The second layer 132 of the first lower electrode 130 may be between the first layers 131 of the first lower electrode 130 inside the first lower electrode hole H1. The second layer 132 of the first lower electrode 130 may be in contact with the first layer 131 of the first lower electrode 130. In an implementation, an upper surface 132a of the second layer 132 of the first lower electrode 130 may be formed between the first supporter pattern 160 and the second supporter pattern 170. In an implementation, the upper surface 132a of the second layer 132 of the first lower electrode 130 may be formed between the upper surface of the first supporter pattern 160 and the lower surface of the second supporter pattern 170. In an implementation, the upper surface 132a of the second layer 132 of the first lower electrode 130 may be formed on the same plane as the upper surface 131a of the first layer 131 of the first lower electrode 130.

In an implementation, the second layer 132 of the first lower electrode 130 may include a material different from that of the first layer 131 of the first lower electrode 130. The second layer 132 of the first lower electrode 130 may include a metal nitride. In an implementation, the second layer 132 of the first lower electrode 130 may include titanium silicon nitride (TiSiN). In an implementation, the second layer 132 of the first lower electrode 130 may include a material different from that of the first layer 131 of the first lower electrode 130, e.g., titanium nitride (TiN), molybdenum nitride (MoN), tantalum nitride (TaN), ruthenium nitride (RuN), niobium nitride (NbN), tungsten nitride (WN), metal (e.g., ruthenium (Ru), iridium (Ir), titanium (Ti), tantalum (Ta), or niobium (Nb)), or a metal oxide.

The third layer 133 of the first lower electrode 130 may be on each of the upper surface 131a of the first layer 131 of the first lower electrode 130 and the upper surface 132a of the second layer 132 of the first lower electrode 130 inside the first lower electrode hole H1. The third layer 133 of the first lower electrode 130 may be in contact with each of the upper surface 131a of the first layer 131 of the first lower electrode 130 and the upper surface 132a of the second layer 132 of the first lower electrode 130. In an implementation, the third layer 133 of the first lower electrode 130 may fill the remaining portion inside the first lower electrode hole H1.

In an implementation, a lower surface of the third layer 133 of the first lower electrode 130 may be formed between the first supporter pattern 160 and the second supporter pattern 170. In an implementation, the lower surface of the third layer 133 of the first lower electrode 130 may be formed between the upper surface of the first supporter pattern 160 and the lower surface of the second supporter pattern 170. In an implementation, the upper surface of the third layer 133 of the first lower electrode 130 may be formed on the same plane as the upper surface of the second supporter pattern 170.

In an implementation, the third layer 133 of the first lower electrode 130 may include a material different from that of the second layer 132 of the first lower electrode 130. In some embodiments, the third layer 133 of the first lower electrode 130 may include the same material as that of the first layer 131 of the first lower electrode 130. In an implementation, the third layer 133 of the first lower electrode 130 may include a material different from that of the first layer 131 of the first lower electrode 130.

The third layer 133 of the first lower electrode 130 may include a metal nitride. In an implementation, the third layer 133 of the first lower electrode 130 may include titanium nitride (TiN). In an implementation, the third layer 133 of the first lower electrode 130 may include, e.g., molybdenum nitride (MoN), tantalum nitride (TaN), ruthenium nitride (RuN), niobium nitride (NbN), tungsten nitride (WN), metal (e.g., ruthenium (Ru), iridium (Ir), titanium (Ti), tantalum (Ta), or niobium (Nb)), or a metal oxide.

In an implementation, the third layer 133 of the first lower electrode 130 may be formed by etching a portion of the sidewall exposed to the open region OR. In an implementation, at least a portion of the sidewall of the third layer 133 of the first lower electrode 130 exposed to the open region OR may be formed to be concave toward the third layer 133 of the first lower electrode 130. In an implementation, as the third layer 133 of the first lower electrode 130 becomes more adjacent to the second layer 132 of the first lower electrode 130, a width of at least a portion of the third layer 133 of the first lower electrode 130 in the first horizontal direction DR1 may be increased continuously. In an implementation, on at least a portion of the sidewall of the third layer 133 of the first lower electrode 130, which is formed to be concave, at least a portion of the open region OR may overlap the second layer 132 of the first lower electrode 130 in the vertical direction DR3.

In an implementation, the third layer 133 of the first lower electrode 130 may include a first portion 133_1, a second portion 133_2, and a third portion 133_3. The first portion 133_1 of the third layer 133 of the first lower electrode 130 may be on the upper surface 131a of the first layer 131 of the first lower electrode 130 and the upper surface 132a of the second layer 132 of the first lower electrode 130. The first portion 133_1 of the third layer 133 of the first lower electrode 130 may be in contact with each of the upper surface 131a of the first layer 131 of the first lower electrode 130 and the upper surface 132a of the second layer 132 of the first lower electrode 130.

In an implementation, a width W1 of the first portion 133_1 of the third layer 133 of the first lower electrode 130 in the first horizontal direction DR1 may be the same as a width between outer sidewalls of the first layer 131 of the first lower electrode 130 in the first horizontal direction DR1. In an implementation, a sidewall 133_1s of the first portion 133_1 of the third layer 133 of the first lower electrode 130 may have the same slope profile as that of the outer sidewall of the first layer 131 of the first lower electrode 130.

The second portion 133_2 of the third layer 133 of the first lower electrode 130 may be on the first portion 133_1 of the third layer 133 of the first lower electrode 130. The second portion 133_2 of the third layer 133 of the first lower electrode 130 may be in contact with an upper surface of the first portion 133_1 of the third layer 133 of the first lower electrode 130.

In an implementation, a sidewall 133_2s of the second portion 133_2 of the third layer 133 of the first lower electrode 130 exposed to the open region OR may be formed to be concave toward the second portion 133_2 of the third layer 133 of the first lower electrode 130. In an implementation, the sidewall 133_2s of the second portion 133_2 of the third layer 133 of the first lower electrode 130 exposed to the open region OR may have a curved shape.

In an implementation, the sidewall 133_2s of the second portion 133_2 of the third layer 133 of the first lower electrode 130 exposed to the open region OR may overlap the second layer 132 of the first lower electrode 130 in the vertical direction DR3. In an implementation, the sidewall 133_2s of the second portion 133_2 of the third layer 133 of the first lower electrode 130 exposed to the open region OR may be spaced apart from the second layer 132 of the first lower electrode 130 in the vertical direction DR3.

In an implementation, at least a portion of the sidewall of the second portion 133_2 of the third layer 133 of the first lower electrode 130 may be in contact with the sidewall of the second supporter pattern 170. In an implementation, the sidewall of the second portion 133_2 of the third layer 133 of the first lower electrode 130 that is in contact with the sidewall of the second supporter pattern 170 may have the same slope profile as that of the sidewall of the first portion 133_1 of the third layer 133 of the first lower electrode 130.

In an implementation, as the second portion 133_2 of the third layer 133 of the first lower electrode 130 becomes more adjacent to the first portion 133_1 of the third layer 133 of the first lower electrode 130, a width W2 of the second portion 133_2 of the third layer 133 of the first lower electrode 130 in the first horizontal direction DR1 may increase continuously. In an implementation, the width W2 of the second portion 133_2 of the third layer 133 of the first lower electrode 130 in the first horizontal direction DR1 may be smaller than the width W1 of the first portion 133_1 of the third layer 133 of the first lower electrode 130 in the first horizontal direction DR1.

The third portion 133_3 of the third layer 133 of the first lower electrode 130 may be on the second portion 133_2 of the third layer 133 of the first lower electrode 130. The third portion 133_3 of the third layer 133 of the first lower electrode 130 may be in contact with the upper surface of the second portion 133_2 of the third layer 133 of the first lower electrode 130.

In an implementation, a sidewall 133_3s of the third portion 133_3 of the third layer 133 of the first lower electrode 130 exposed to the open region OR may have the same slope profile as that of the sidewall 133_1s of the first portion 133_1 of the third layer 133 of the first lower electrode 130 exposed to the open region OR. In an implementation, at least a portion of the sidewall 133_3s of the third portion 133_3 of the third layer 133 of the first lower electrode 130 may be in contact with the sidewall of the second supporter pattern 170. In an implementation, the sidewall 133_3s of the third portion 133_3 of the third layer 133 of the first lower electrode 130 that is in contact with the sidewall of the second supporter pattern 170 may have the same slope profile as that of the sidewall of the second portion 133_2 of the third layer 133 of the first lower electrode 130. In an implementation, a width W3 of the third portion 133_3 of the third layer 133 of the first lower electrode 130 in the first horizontal direction DR1 may be smaller than the width W2 of the second portion 133_2 of the third layer 133 of the first lower electrode 130 in the first horizontal direction DR1.

In an implementation, the third layer 133 of the first lower electrode 130 may include the first portion 133_1, the second portion 133_2, and the third portion 133_3, as illustrated in FIGS. 2 and 3. In an implementation, the first portion 133_1 of the third layer 133 of the first lower electrode 130 may be omitted. In an implementation, the second portion 133_2 of the third layer 133 of the first lower electrode 130 may be in contact with each of the upper surface 131a of the first layer 131 of the first lower electrode 130 and the upper surface 132a of the second layer 132 of the first lower electrode 130.

The second lower electrode 140 may be inside the second lower electrode hole H2. In an implementation, the second lower electrode 140 may completely fill the inside of the second lower electrode hole H2 on the contact plug 105. That is, the second lower electrode 140 may have a pillar shape. The second lower electrode 140 may be spaced apart from the first lower electrode 130 in the first horizontal direction DR1. The second lower electrode 140 may be extended in the vertical direction DR3 by passing through the etch stop layer 120 on the contact plug 105. The second lower electrode 140 may be electrically connected to the contact plug 105. The second lower electrode 140 may be in contact with each of the sidewall of the first supporter pattern 160 and the sidewall of the second supporter pattern 170. In an implementation, the uppermost surface of the second lower electrode 140 may be formed on the same plane as the upper surface of the second supporter pattern 170.

The second lower electrode 140 may include a first layer 141, a second layer 142, and a third layer 143. The first layer 141 of the second lower electrode 140 may be located along a portion of a sidewall and a bottom surface of the second lower electrode hole H2. The first layer 141 of the second lower electrode 140 may be in contact with the contact plug 105. In an implementation, the first layer 141 of the second lower electrode 140 may be conformal. In an implementation, the upper surface of the first layer 141 of the second lower electrode 140 may be formed between the first supporter pattern 160 and the second supporter pattern 170. In an implementation, the upper surface of the first layer 141 of the second lower electrode 140 may be formed between the upper surface of the first supporter pattern 160 and the lower surface of the second supporter pattern 170. In an implementation, the first layer 141 of the second lower electrode 140 may include the same material as that of the first layer 131 of the first lower electrode 130.

The second layer 142 of the second lower electrode 140 may be between the first layers 141 of the second lower electrode 140 inside the second lower electrode hole H2. The second layer 142 of the second lower electrode 140 may be in contact with the first layer 141 of the second lower electrode 140. In an implementation, the upper surface of the second layer 142 of the second lower electrode 140 may be formed between the first supporter pattern 160 and the second supporter pattern 170. In an implementation, the upper surface of the second layer 142 of the second lower electrode 140 may be formed between the upper surface of the first supporter pattern 160 and the lower surface of the second supporter pattern 170. In an implementation, the upper surface of the second layer 142 of the second lower electrode 140 may be formed on the same plane as the upper surface of the first layer 141 of the second lower electrode 140. In an implementation, the second layer 142 of the second lower electrode 140 may include the same material as that of the second layer 132 of the first lower electrode 130.

The third layer 143 of the second lower electrode 140 may be on each of the upper surface of the first layer 141 of the second lower electrode 140 and the upper surface of the second layer 142 of the second lower electrode 140 inside the second lower electrode hole H2. The third layer 143 of the second lower electrode 140 may be in contact with each of the upper surface of the first layer 141 of the second lower electrode 140 and the upper surface of the second layer 142 of the second lower electrode 140. In an implementation, the third layer 143 of the second lower electrode 140 may fill the remaining portion inside the second lower electrode hole H2.

In an implementation, the lower surface of the third layer 143 of the second lower electrode 140 may be formed between the first supporter pattern 160 and the second supporter pattern 170. In an implementation, the lower surface of the third layer 143 of the second lower electrode 140 may be formed between the upper surface of the first supporter pattern 160 and the lower surface of the second supporter pattern 170. In an implementation, the upper surface of the third layer 143 of the second lower electrode 140 may be formed on the same plane as the upper surface of the second supporter pattern 170. In an implementation, the third layer 143 of the second lower electrode 140 may include the same material as that of the third layer 133 of the first lower electrode 130.

In an implementation, the third layer 143 of the second lower electrode 140 may be formed by etching a portion of a sidewall exposed to the open region OR. In an implementation, at least a portion of the sidewall of the third layer 143 of the second lower electrode 140 exposed to the open region OR may be formed to be concave toward the third layer 143 of the second lower electrode 140. In an implementation, as the third layer 143 of the second lower electrode 140 becomes more adjacent to the second layer 142 of the second lower electrode 140, a width of at least a portion of the third layer 143 of the second lower electrode 140 in the first horizontal direction DR1 may increase continuously. In an implementation, on at least a portion of the sidewall of the third layer 143 of the recessed second lower electrode 140, at least a portion of the open region OR may overlap the second layer 142 of the second lower electrode 140 in the vertical direction DR3.

In an implementation, the third layer 143 of the second lower electrode 140 may include a first portion 143_1, a second portion 143_2, and a third portion 143_3. The first portion 143_1 of the third layer 143 of the second lower electrode 140 may be on the upper surface of the first layer 141 of the second lower electrode 140 and the upper surface of the second layer 142 of the second lower electrode 140. The first portion 143_1 of the third layer 143 of the second lower electrode 140 may be in contact with each of the upper surface of the first layer 141 of the second lower electrode 140 and the upper surface of the second layer 142 of the second lower electrode 140.

In an implementation, a width of the first portion 143_1 of the third layer 143 of the second lower electrode 140 in the first horizontal direction DR1 may be the same as a width between outer sidewalls of the first layer 141 of the second lower electrode 140 in the first horizontal direction DR1. In an implementation, a sidewall 143_1s of the first portion 143_1 of the third layer 143 of the second lower electrode 140 may have the same slope profile as that of the outer sidewall of the first layer 141 of the second lower electrode 140.

The second portion 143_2 of the third layer 143 of the second lower electrode 140 may be on the first portion 143_1 of the third layer 143 of the second lower electrode 140. The second portion 143_2 of the third layer 143 of the second lower electrode 140 may be in contact with an upper surface of the first portion 143_1 of the third layer 143 of the second lower electrode 140.

In an implementation, a sidewall 143_2s of the second portion 143_2 of the third layer 143 of the second lower electrode 140 exposed to the open region OR may be formed to be concave toward the second portion 143_2 of the third layer 143 of the second lower electrode 140. That is, the sidewall 143_2s of the second portion 143_2 of the third layer 143 of the second lower electrode 140 exposed to the open region OR may have a curved shape.

In an implementation, the sidewall 143_2s of the second portion 143_2 of the third layer 143 of the second lower electrode 140 exposed to the open region OR may overlap the second layer 142 of the second lower electrode 140 in the vertical direction DR3. In an implementation, the sidewall 143_2s of the second portion 143_2 of the third layer 143 of the second lower electrode 140 exposed to the open region OR may be spaced apart from the second layer 142 of the second lower electrode 140 in the vertical direction DR3.

In an implementation, at least a portion of the sidewall of the second portion 143_2 of the third layer 143 of the second lower electrode 140 may be in contact with the sidewall of the second supporter pattern 170. In an implementation, the sidewall of the second portion 143_2 of the third layer 143 of the second lower electrode 140 that is in contact with the sidewall of the second supporter pattern 170 may have the same slope profile as that of the sidewall of the first portion 143_1 of the third layer 143 of the second lower electrode 140.

In an implementation, as the second portion 143_2 of the third layer 143 of the second lower electrode 140 becomes more adjacent to the first portion 143_1 of the third layer 143 of the second lower electrode 140, a width of the second portion 143_2 of the third layer 143 of the second lower electrode 140 in the first horizontal direction DR1 may be increased continuously. In an implementation, the width of the second portion 143_2 of the third layer 143 of the second lower electrode 140 in the first horizontal direction DR1 may be smaller than the width of the first portion 143_1 of the third layer 143 of the second lower electrode 140 in the first horizontal direction DR1.

The third portion 143_3 of the third layer 143 of the second lower electrode 140 may be on the second portion 143_2 of the third layer 143 of the second lower electrode 140. The third portion 143_3 of the third layer 143 of the second lower electrode 140 may be in contact with the upper surface of the second portion 143_2 of the third layer 143 of the second lower electrode 140.

In an implementation, a sidewall 143_3s of the third portion 143_3 of the third layer 143 of the second lower electrode 140 exposed to the open region OR may have the same slope profile as that of the sidewall 143_1s of the first portion 143_1 of the third layer 133 of the second lower electrode 140 exposed to the open region OR. In an implementation, at least a portion of the sidewall 143_3s of the third portion 143_3 of the third layer 143 of the second lower electrode 140 may be in contact with the sidewall of the second supporter pattern 170. In an implementation, the sidewall 143_3s of the third portion 143_3 of the third layer 143 of the second lower electrode 140 that is in contact with the sidewall of the second supporter pattern 170 may have the same slope profile as that of the sidewall of the second portion 143_2 of the third layer 143 of the second lower electrode 140. In an implementation, a width of the third portion 143_3 of the third layer 133 of the second lower electrode 140 in the first horizontal direction DR1 may be smaller than the width of the second portion 143_2 of the third layer 143 of the second lower electrode 140 in the first horizontal direction DR1.

In an implementation, the third layer 143 of the second lower electrode 140 may include the first portion 143_1, the second portion 143_2, and the third portion 143_3, as illustrated in FIGS. 2 and 3. In an implementation, the first portion 143_1 of the third layer 143 of the second lower electrode 140 may be omitted. In an implementation, the second portion 143_2 of the third layer 143 of the second lower electrode 140 may be in contact with each of the upper surface of the first layer 141 of the second lower electrode 140 and the upper surface of the second layer 142 of the second lower electrode 140.

In an implementation, a width of the open region OR in the first horizontal direction DR1 between the sidewall 133_3s of the third portion 133_3 of the third layer 133 of the first lower electrode 130 and the sidewall 143_3s of the third portion 143_3 of the third layer 143 of the second lower electrode 140 may be greater than a width of the open region OR in the first horizontal direction DR1 between the sidewall 133_2s of the second portion 133_2 of the third layer 133 of the first lower electrode 130 and the sidewall 143_2s of the second portion 143_2 of the third layer 143 of the second lower electrode 140. In an implementation, the width of the open region OR in the first horizontal direction DR1 between the sidewall 133_2s of the second portion 133_2 of the third layer 133 of the first lower electrode 130 and the sidewall 143_2s of the second portion 143_2 of the third layer 143 of the second lower electrode 140 may be continuously reduced as the open region OR becomes more adjacent to the substrate 100.

Also, the width of the open region OR in the first horizontal direction DR1 between the sidewall 133_2s of the second portion 133_2 of the third layer 133 of the first lower electrode 130 and the sidewall 143_2s of the second portion 143_2 of the third layer 143 of the second lower electrode 140 may be greater than the width of the open region OR in the first horizontal direction DR1 between the sidewall 133_1s of the first portion 133_1 of the third layer 133 of the first lower electrode 130 and the sidewall 143_1s of the first portion 143_1 of the third layer 143 of the second lower electrode 140.

The third lower electrode 150 may be inside the third lower electrode hole H3. The third lower electrode 150 may be spaced apart from each of the first lower electrode 130 and the second lower electrode 140 at the same interval. The third lower electrode 150 may have a similar structure to each of the first lower electrode 130 and the second lower electrode 140. Therefore, a detailed description of the third lower electrode 150 will not be repeated.

In an implementation, the capacitor dielectric layer 180 may be conformal on the etch stop layer 120, the first supporter pattern 160, the second supporter pattern 170, the first to third lower electrodes 130, 140 and 150, respectively. In an implementation, the capacitor dielectric layer 180 may be on the upper surface of the second supporter pattern 170 and the upper surface of each of the first to third lower electrodes 130, 140 and 150. In an implementation, the capacitor dielectric layer 180 may be on sidewalls of the first to third lower electrodes 130, 140 and 150 exposed to the open region OR. In an implementation, the capacitor dielectric layer 180 may be on the sidewall of each of the first supporter pattern 160 and the second supporter pattern 170, which are exposed to the open region OR.

The capacitor dielectric layer 180 may include, e.g., silicon oxide ($SiO_2$), silicon nitride (SiN), silicon oxynitride (SiON), or a high dielectric constant material. The high dielectric constant material may include, e.g., hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

The upper electrode 190 may be on the capacitor dielectric layer 180. The upper electrode 190 may be between the etch stop layer 120 and the first supporter pattern 160, between the first supporter pattern 160 and the second supporter pattern 170, and on the upper surface of the second supporter pattern 170. In addition, the upper electrode 190 may fill the inside of the open region OR on the capacitor dielectric layer 180. The upper electrode 190 may include, e.g., doped polysilicon, metal, metal nitride, or metal silicide.

In an implementation, at least a portion of the upper electrode 190 may overlap the second layer 132 of the first lower electrode 130 in the vertical direction DR3 inside the open region OR. In an implementation, a lower surface of at least a portion of the upper electrode 190 overlapped with the second layer 132 of the first lower electrode 130 in the vertical direction DR3 may be formed to be higher than the upper surface 132a of the second layer 132 of the first lower electrode 130. In an implementation, at least a portion of the upper electrode 190 may overlap the second layer 142 of the second lower electrode 140 in the vertical direction DR3 inside the open region OR. In an implementation, the lower surface of at least a portion of the upper electrode 190 overlapped with the second layer 142 of the second lower electrode 140 in the vertical direction DR3 may be formed to be higher than the upper surface of the second layer 142 of the second lower electrode 140.

In an implementation, a width W6 of the upper electrode 190 in the first horizontal direction DR1 between the sidewall 133_3s of the third portion 133_3 of the third layer 133 of the first lower electrode 130 and the sidewall 143_3s of the third portion 143_3 of the third layer 143 of the second lower electrode 140 may be greater than a width W5 of the upper electrode 190 in the first horizontal direction DR1 between the sidewall 133_2s of the second portion 133_2 of the third layer 133 of the first lower electrode 130 and the sidewall 143_2s of the second portion 143_2 of the third layer 143 of the second lower electrode 140. In an implementation, the width W5 of the upper electrode 190 in the first horizontal direction DR1 between the sidewall 133_2s of the second portion 133_2 of the third layer 133 of the first lower electrode 130 and the sidewall 143_2s of the second portion 143_2 of the third layer 143 of the second lower electrode 140 may be continuously reduced as the upper electrode 190 becomes more adjacent to the substrate 100.

In an implementation, the width W5 of the upper electrode 190 in the first horizontal direction DR1 between the sidewall 133_2s of the second portion 133_2 of the third layer 133 of the first lower electrode 130 and the sidewall 143_2s of the second portion 143_2 of the third layer 143 of the second lower electrode 140 may be greater than a width W4 of the upper electrode 190 in the first horizontal direction DR1 between the sidewall 133_1s of the first portion 133_1 of the third layer 133 of the first lower electrode 130 and the sidewall 143_1s of the first portion 143_1 of the third layer 143 of the second lower electrode 140.

In the semiconductor device according to some embodiments of the present disclosure, the lower electrode 130 may include a plurality of layers including a lower layer, which includes a first layer 131 that is an inner layer and a second layer 132 that is an outer layer, and a third layer 133 that is an upper layer on the lower layer. Therefore, in the semiconductor device according to some embodiments of the present disclosure, in the process of forming the open region OR among the plurality of lower electrodes 130, 140 and 150, heights of the first layer 131 and the second layer 132 may be adjusted such that only the sidewall of the third layer 133 is etched, such that the second layer 132, which is an inner layer of the lower layer, may be prevented from being etched to prevent the first layer 131, which is an outer layer of the lower layer, from being inclined so as to not be in contact with another lower electrode.

Hereinafter, a method of manufacturing a semiconductor device according to some embodiments of the present disclosure will be described with reference to FIGS. 2 to 16.

FIGS. 5 to 16 are views illustrating stages in a method of manufacturing a semiconductor device according to some embodiments of the present disclosure.

Figure 5:
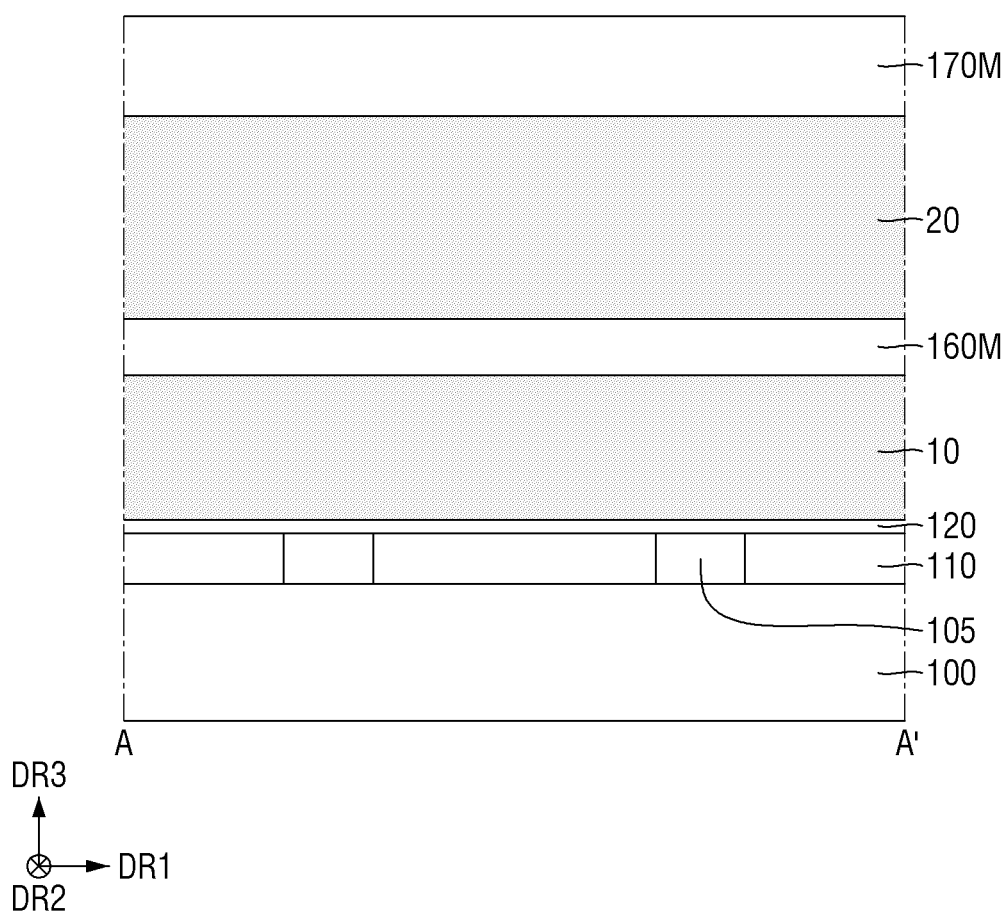
FIGS. 5 to 16 are views illustrating stages in a method of manufacturing a semiconductor device according to some embodiments of the present disclosure.
Figure 6:
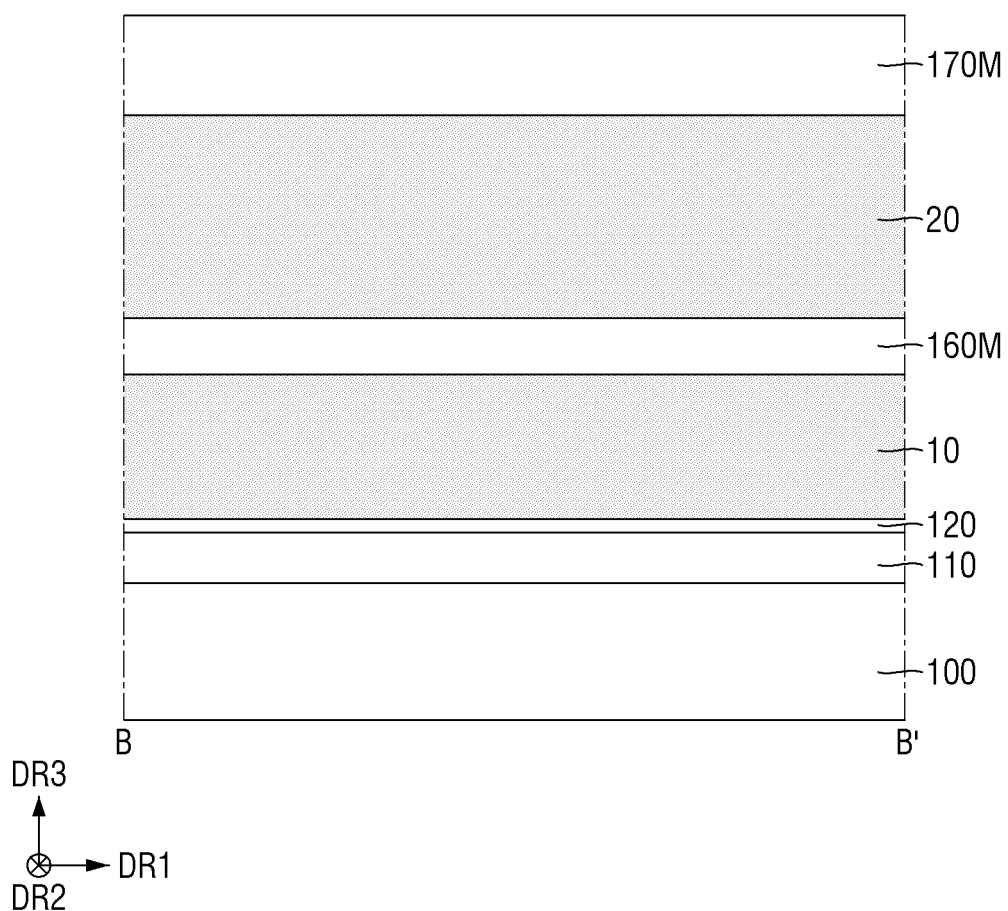

Referring to FIGS. 5 and 6, an interlayer insulating layer 110 may be formed on a substrate 100. In addition, a contact plug 105 may be formed inside the interlayer insulating layer 110. Subsequently, an etch stop layer 120, a first mold layer 10, a first supporter material layer 160M, a second mold layer 20, and a second supporter material layer 170M may be sequentially formed on the interlayer insulating layer 110 and the contact plug 105. In an implementation, each of the first supporter material layer 160M and the second supporter material layer 170M may include, e.g., silicon oxynitride (SiON), silicon nitride (SiN), silicon carbon nitride (SiCN), or tantalum oxide (TaO).

Each of the first mold layer 10 and the second mold layer 20 may include, e.g., silicon oxide ($SiO_2$). Each of the first mold layer 10 and the second mold layer 20 may include, e.g., a flowable oxide (FOX), a Tonen SilaZen (TOSZ), an undoped silica glass (USG), a Borosilaca Glass (BSG), a Phosphosilaca Glass (PSG), a BoroPhosphosilaca Glass (BPSG), a Plasma Enhanced Tetra Ethyl Ortho Silicate (PE-TEOS), a Fluoride Silicate Glass (FSG), or their combination.

Figure 7:
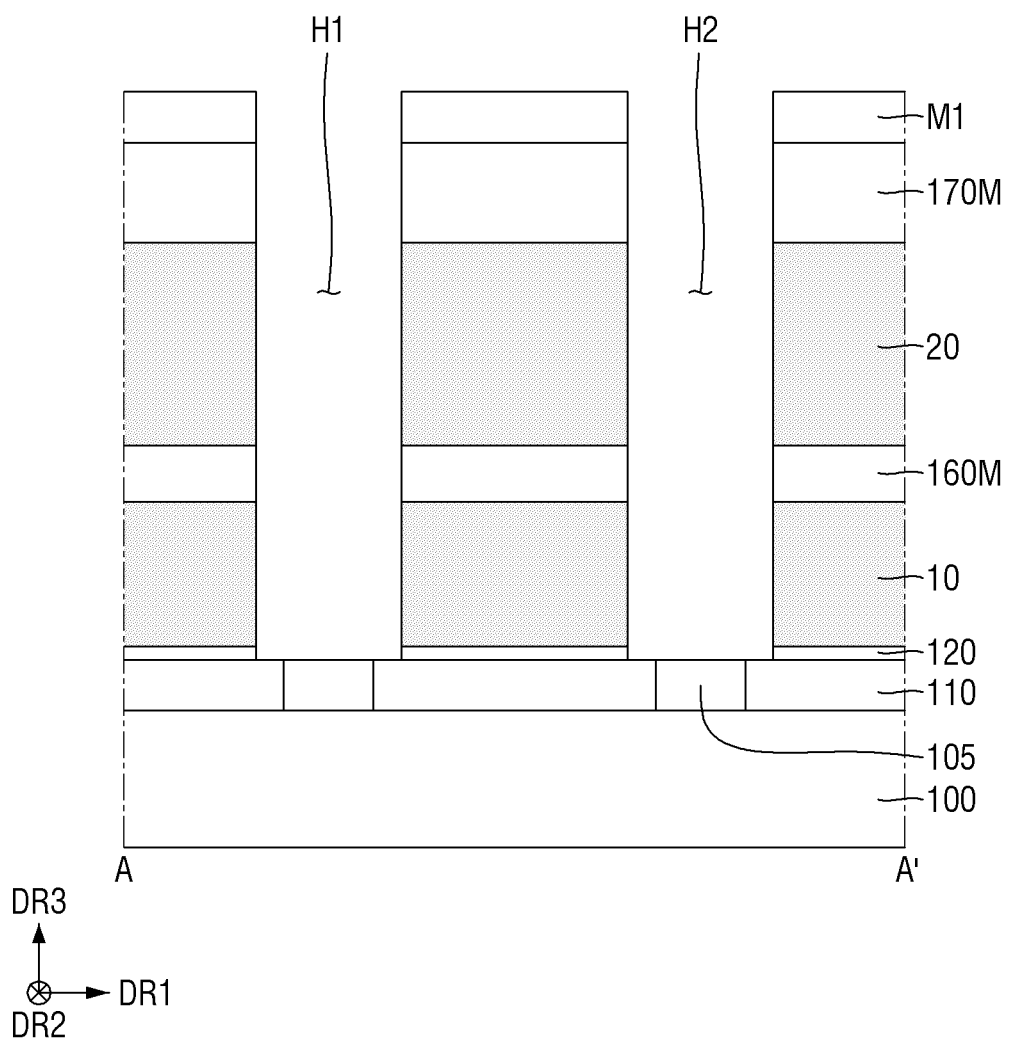

Referring to FIG. 7, a first mask pattern M1 may be formed on the second supporter material layer 170M. Subsequently, a first lower electrode hole H1 and a second lower electrode hole H2, which pass through the etch stop layer 120, the first mold layer 10, the first supporter material layer 160M, the second mold layer 20, and the second supporter material layer 170M in the vertical direction DR3, may be formed using the first mask pattern M1 as a mask. The second lower electrode hole H2 may be spaced apart from the first lower electrode hole H1 in the first horizontal direction DR1. The contact plug 105 may be exposed by the first lower electrode hole H1 and the second lower electrode hole H2.

Figure 8:
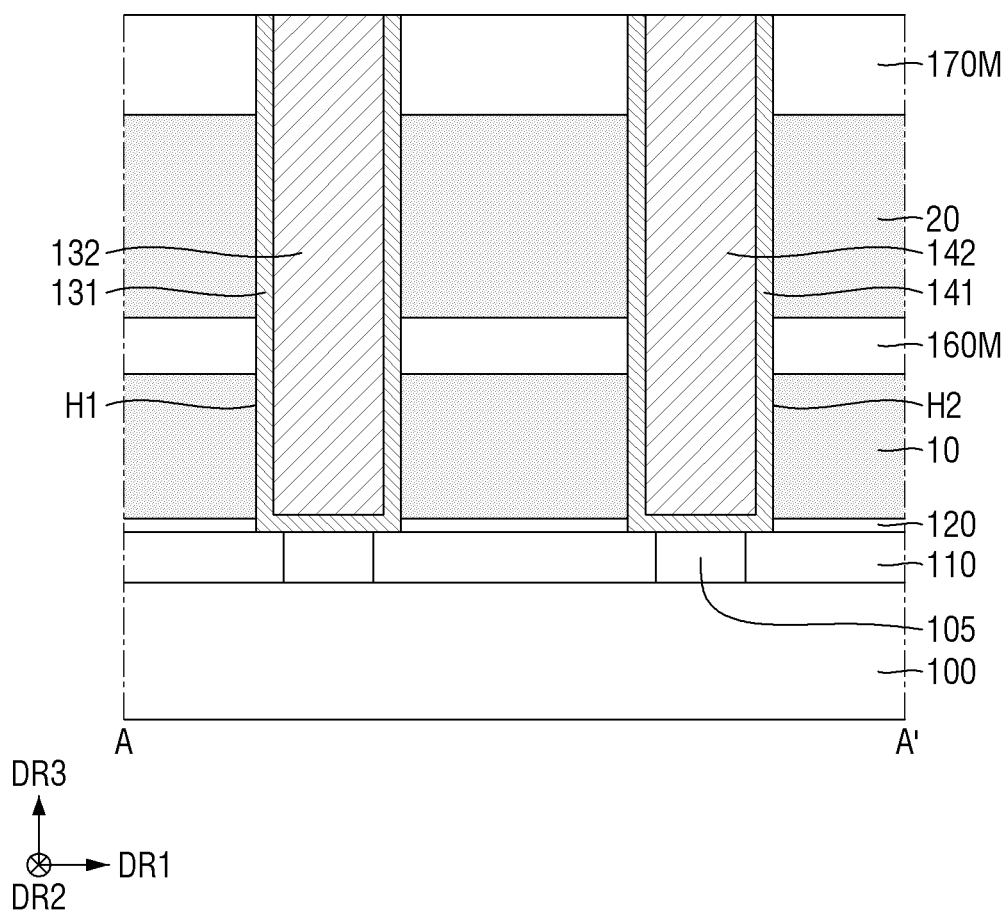

Referring to FIG. 8, a first layer 131 of a first lower electrode (130 of FIG. 2) may be formed along a sidewall and a bottom surface of a first lower electrode hole H1. Also, a first layer 141 of a second lower electrode (140 of FIG. 2) may be formed along a sidewall and a bottom surface of the second lower electrode hole H2. In an implementation, each of the first layer 131 of the first lower electrode (130 of FIG. 2) and the first layer 141 of the second lower electrode (140 of FIG. 2) may be formed to be conforming. The first layer 131 of the first lower electrode (130 of FIG. 2) and the first layer 141 of the second lower electrode (140 of FIG. 2) may be formed through the same manufacturing process.

Subsequently, a second layer 132 of the first lower electrode (130 of FIG. 2) may be formed on the first layer 131 of the first lower electrode (130 of FIG. 2) to fill the inside of the first lower electrode hole H1. In addition, a second layer 142 of the second lower electrode (140 of FIG. 2) may be formed on the first layer 141 of the second lower electrode (140 of FIG. 2) to fill the inside of the second lower electrode hole H2. The second layer 132 of the first lower electrode (130 of FIG. 2) and the second layer 142 of the second lower electrode (140 of FIG. 2) may be formed through the same manufacturing process.

Subsequently, an upper surface of the second supporter material layer 170M may be exposed by a planarization process. The first mask pattern M1 may be removed through the planarization process. Also, through the planarization process, the upper surface of the second supporter material layer 170M, the uppermost surface of the first layer 131 of the first lower electrode (130 of FIG. 2), the uppermost surface of the second layer 132 of the first lower electrode (130 of FIG. 2), the uppermost surface of the first layer 141 of the second lower electrode (140 of FIG. 2), and the uppermost surface of the second layer 142 of the second lower electrode (140 of FIG. 2) may be formed on the same plane.

Figure 9:
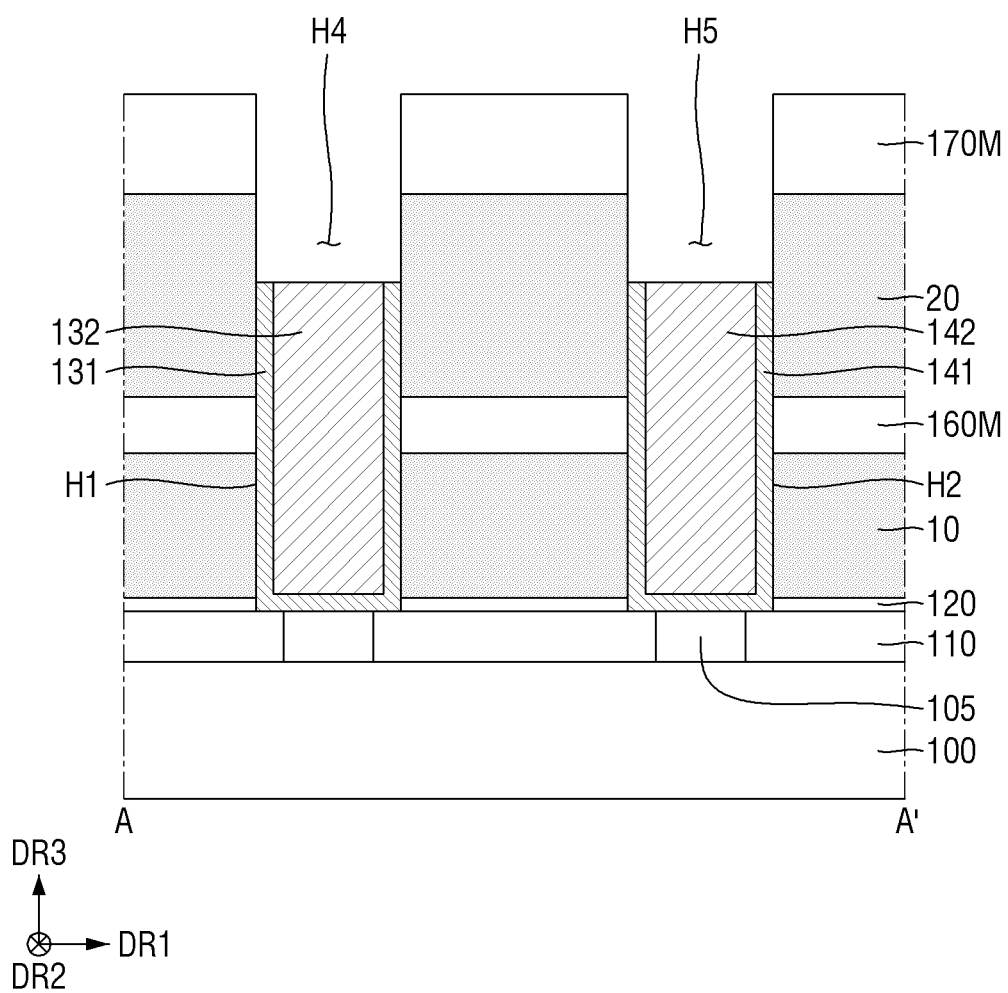

Referring to FIG. 9, a portion of the first layer 131 of the first lower electrode (130 of FIG. 2) and a portion of the second layer 132 of the first lower electrode (130 of FIG. 2) may be etched to form a fourth lower electrode hole H4. In an implementation, a bottom surface of the fourth lower electrode hole H4 may be formed between the upper surface of the first supporter material layer 160M and the lower surface of the second supporter material layer 170M. Further, a portion of the first layer 141 of the second lower electrode (140 of FIG. 2) and a portion of the second layer 142 of the second lower electrode (140 of FIG. 2) may be etched to form a fifth lower electrode hole H5. In an implementation, a bottom surface of the fifth lower electrode hole H5 may be formed between the upper surface of the first supporter material layer 160M and the lower surface of the second supporter material layer 170M. The fourth lower electrode hole H4 and the fifth lower electrode hole H5 may be formed through the same manufacturing process.

Figure 10:
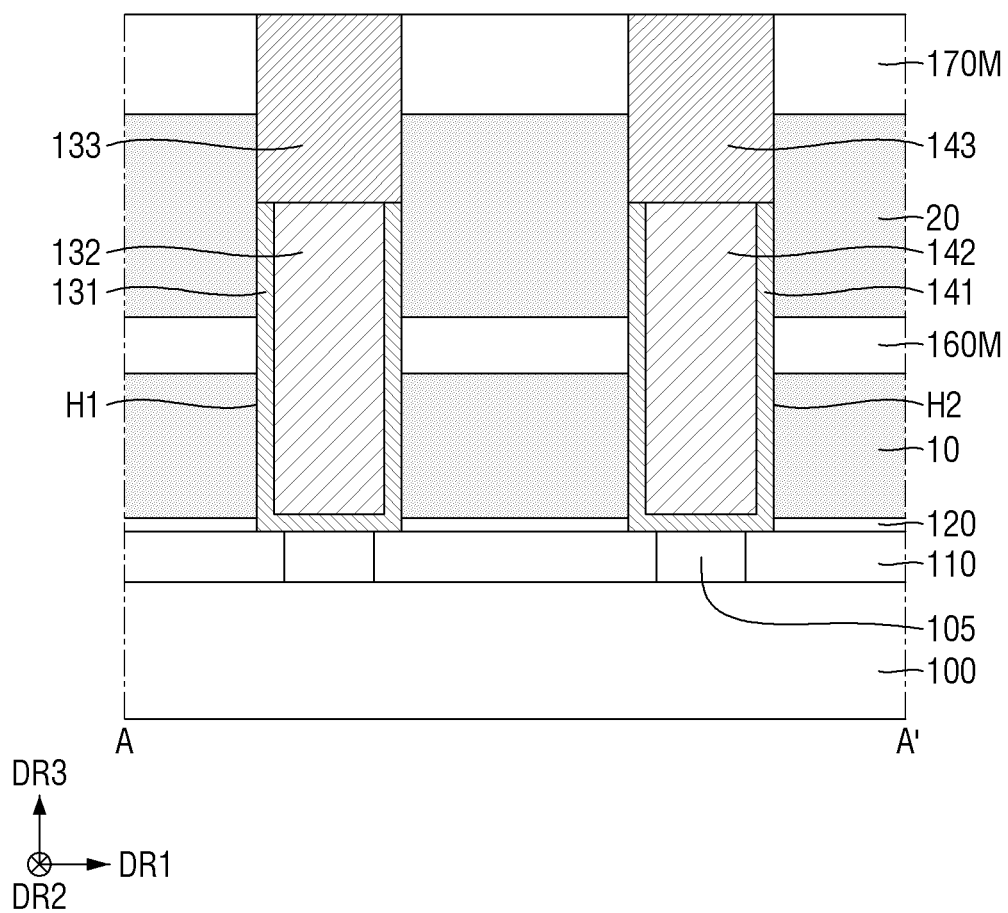

Referring to FIG. 10, a third layer 133 of the first lower electrode (130 of FIG. 2) may be formed inside the fourth lower electrode hole (H4 of FIG. 9). In addition, a third layer 143 of the second lower electrode (140 of FIG. 2) may be formed inside the fifth lower electrode hole (H5 of FIG. 9). The upper surface of the third layer 133 of the first lower electrode (130 of FIG. 2) and the upper surface of the third layer 143 of the second lower electrode (140 of FIG. 2) may be formed on the same plane as the upper surface of the second supporter material layer 170M. Each of the third layer 133 of the first lower electrode (130 of FIG. 2) and the third layer 143 of the second lower electrode (140 of FIG. 2) may be formed through the same manufacturing process.

Figure 11:
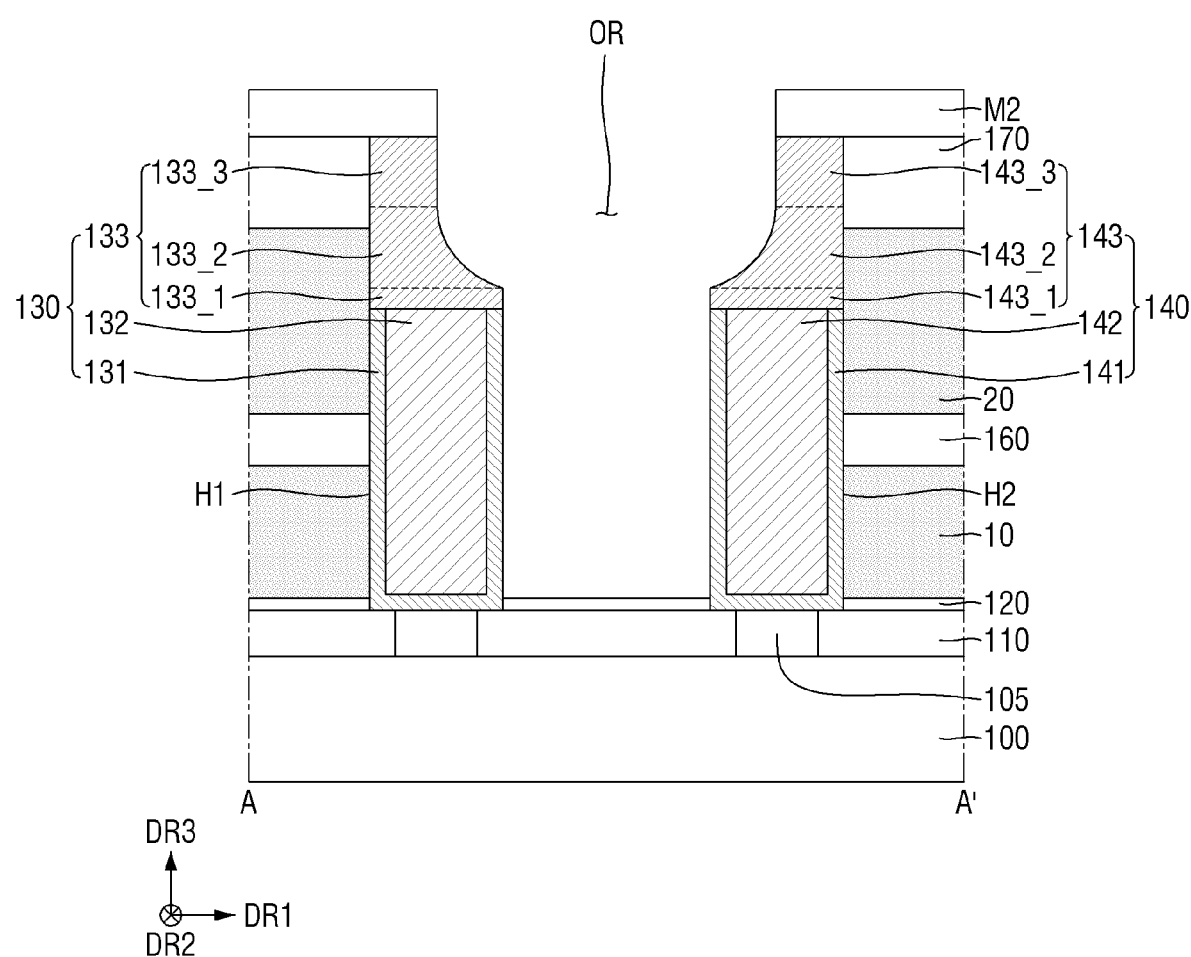
Figure 12:
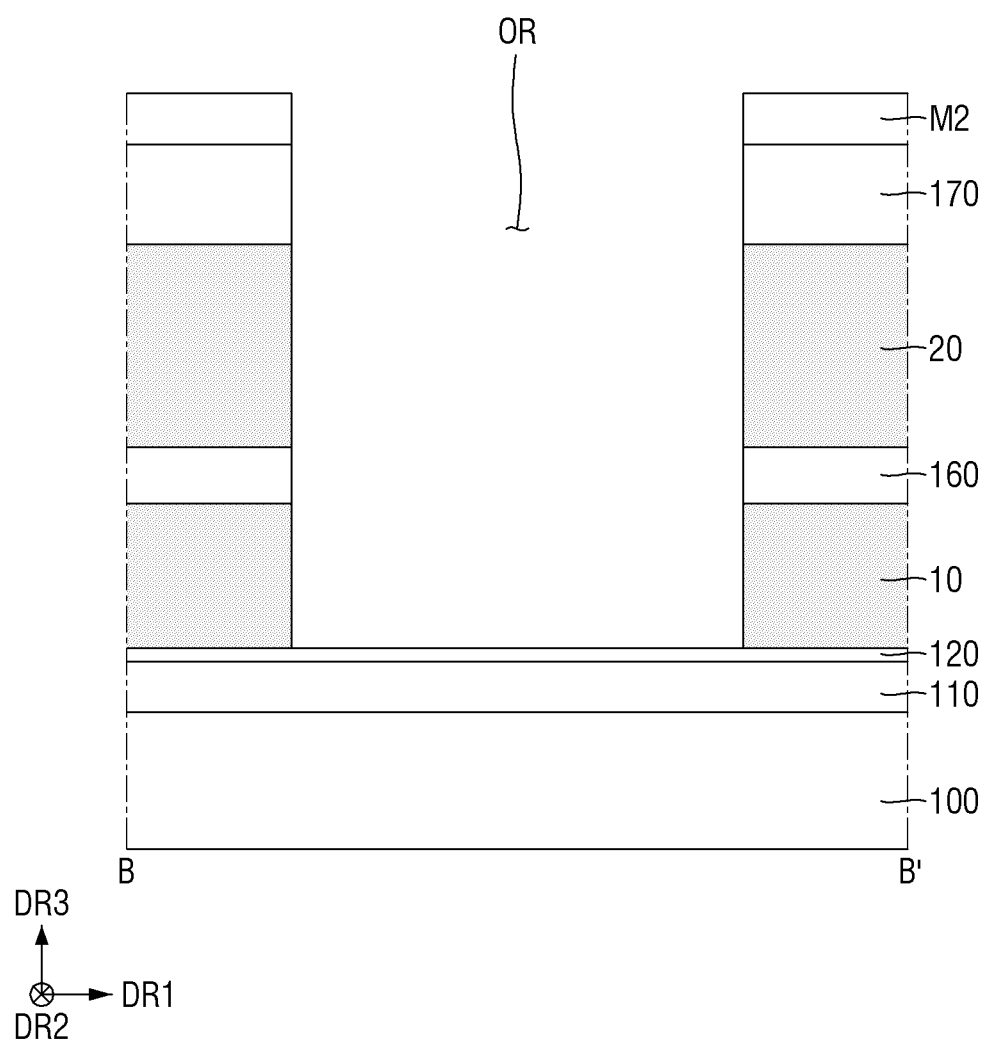

Referring to FIGS. 11 and 12, a second mask pattern M2 may be formed on the upper surface of the second supporter material layer 170M. The second mask pattern M2 may expose a portion of the first lower electrode 130, a portion of the second lower electrode 140, and the second supporter material layer (170M of FIG. 10) between the first lower electrode 130 and the second lower electrode 140.

Subsequently, the second supporter material layer (170M of FIG. 10), the second mold layer 20, the first supporter material layer (160M of FIG. 10), and the first mold layer 10 between the first lower electrode 130 and the second lower electrode 140 may be etched to form an open region OR by using the second mask pattern M2 as a mask. A portion of a sidewall of the third layer 133 of the first lower electrode 130 and a portion of a sidewall of the third layer 143 of the second lower electrode 140 may be etched while the open region OR is being formed. After the open region OR is formed, the first supporter material layer (160M of FIG. 10) may be defined as a first supporter pattern 160, and the second supporter material layer (170M of FIG. 10) may be defined as a second supporter pattern 170.

Figure 13:
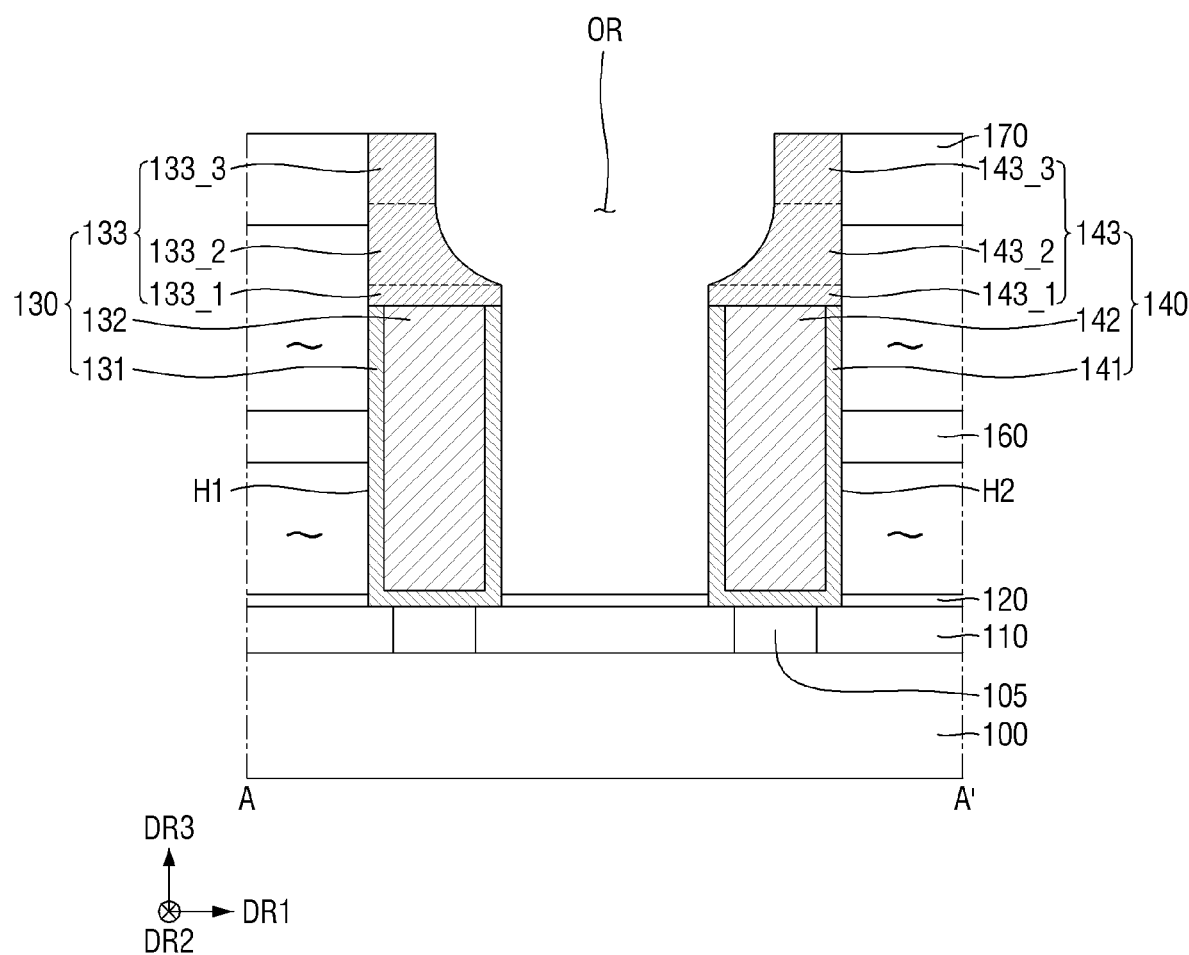
Figure 14:
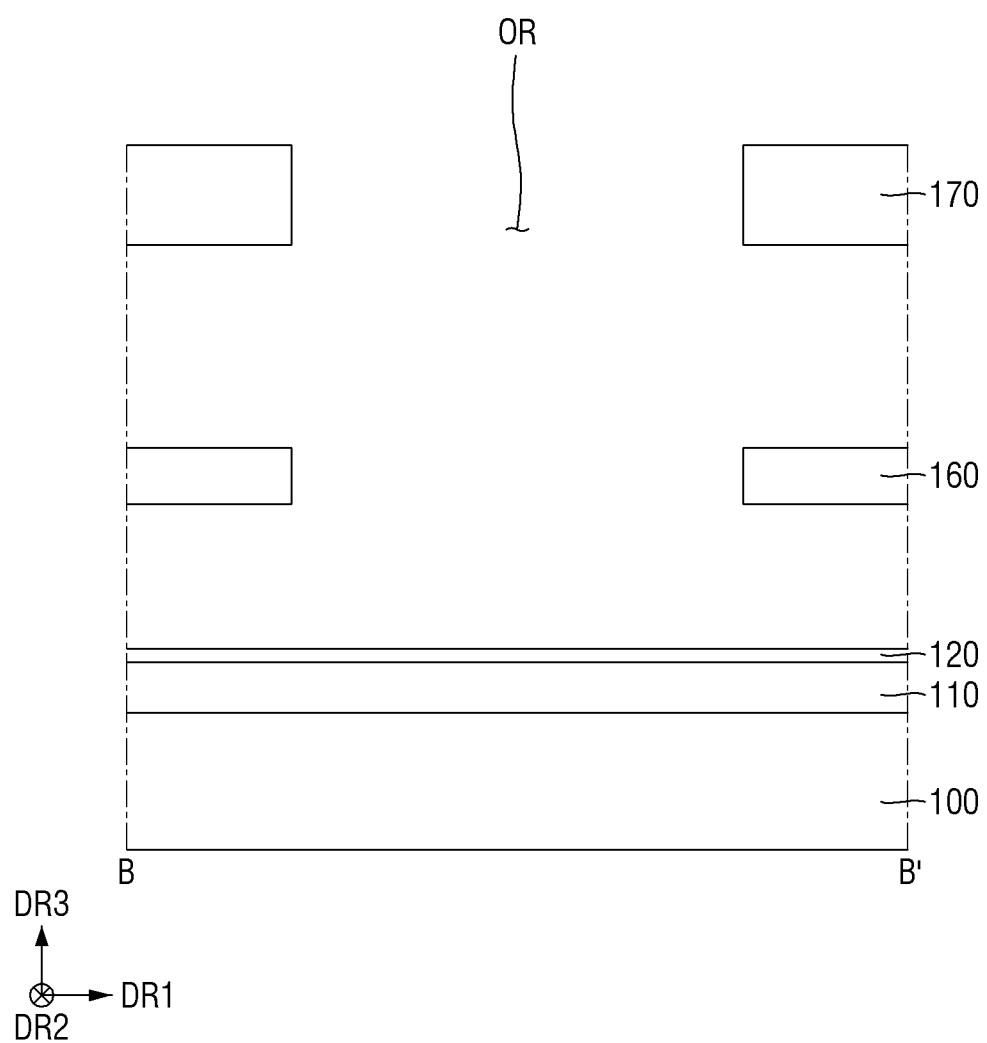

Referring to FIGS. 13 and 14, each of the second mask pattern (M2 of FIGS. 11 and 12), the first mold layer (10 of FIGS. 11 and 12) and the second mold layer (20 of FIGS. 11 and 12) may be removed. Each of the second mask pattern (M2 of FIGS. 11 and 12), the first mold layer (10 of FIGS. 11 and 12) and the second mold layer (20 in FIGS. 11 and 12) may be removed through a wet etching process.

Figure 15:
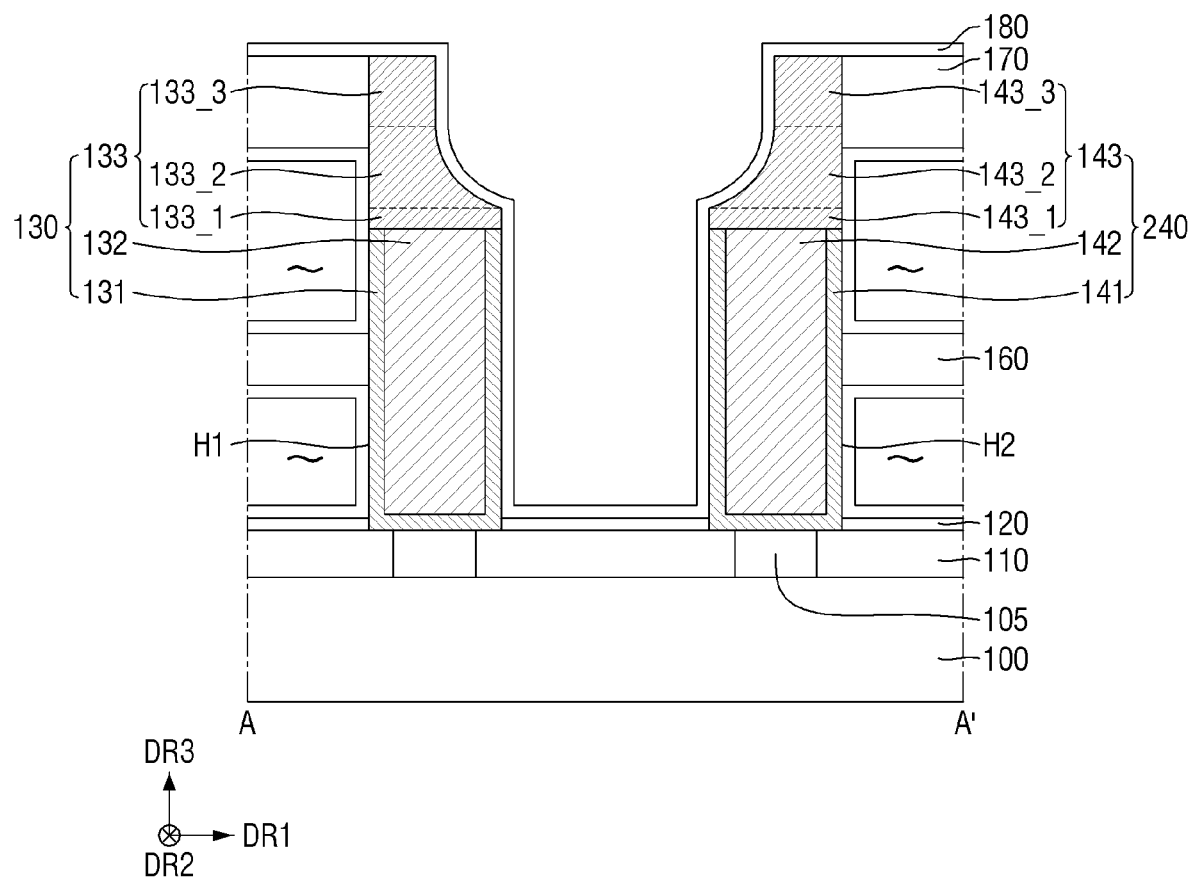
Figure 16:
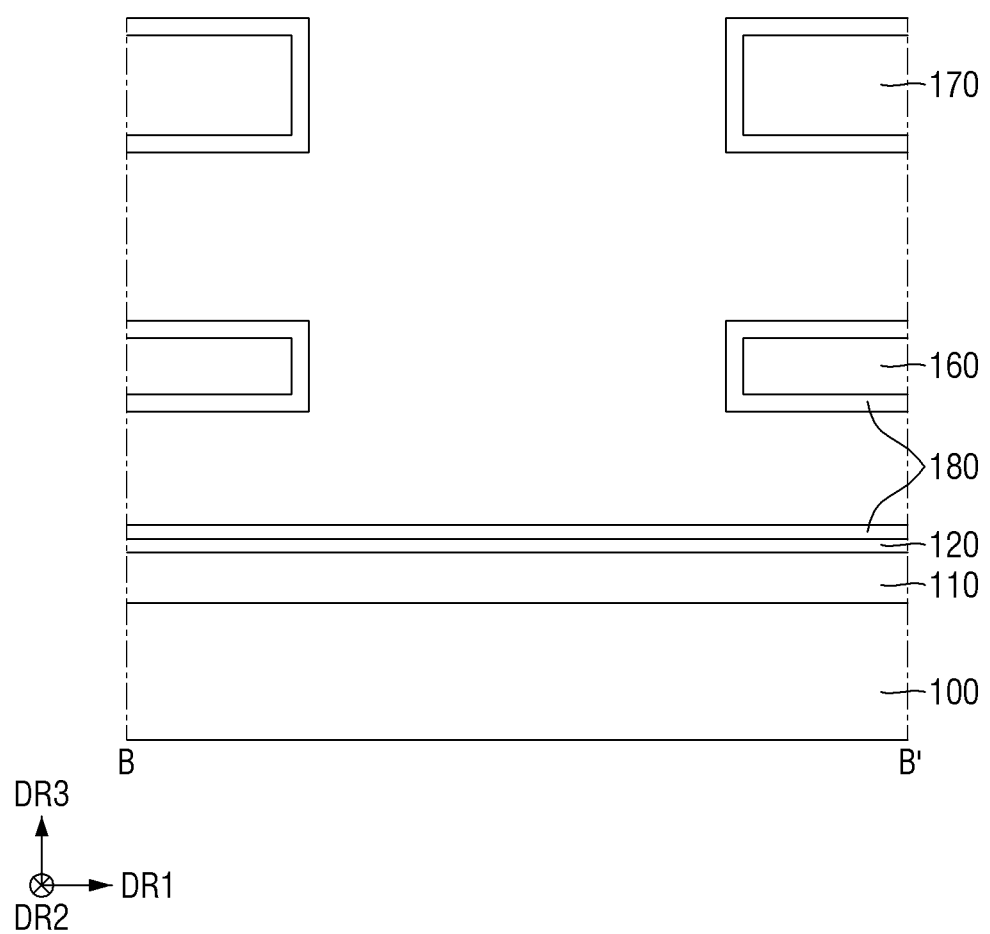

Referring to FIGS. 15 and 16, a capacitor dielectric layer 180 may be formed along the exposed surfaces of the etch stop layer 120, the first supporter pattern 160, the second supporter pattern 170, and the first to third lower electrodes 130, 140 and 150. In an implementation, the capacitor dielectric layer 180 may be formed to be conformal.

Referring to FIGS. 2 to 4, an upper electrode 190 may be formed on the capacitor dielectric layer 180. The upper electrode 190 may be formed between the etch stop layer 120 and the first supporter pattern 160, between the first supporter pattern 160 and the second supporter pattern 170, and on the upper surface of the second supporter pattern 170. In addition, the upper electrode 190 may fill the inside of the open region OR on the capacitor dielectric layer 180. Through this manufacturing process, the semiconductor device shown in FIGS. 2 to 4 may be manufactured.

Hereinafter, a semiconductor device according to some other embodiments of the present disclosure will be described with reference to FIGS. 17 and 18. The following description will be based on differences from the semiconductor devices shown in FIGS. 1 to 4.

Figure 17:
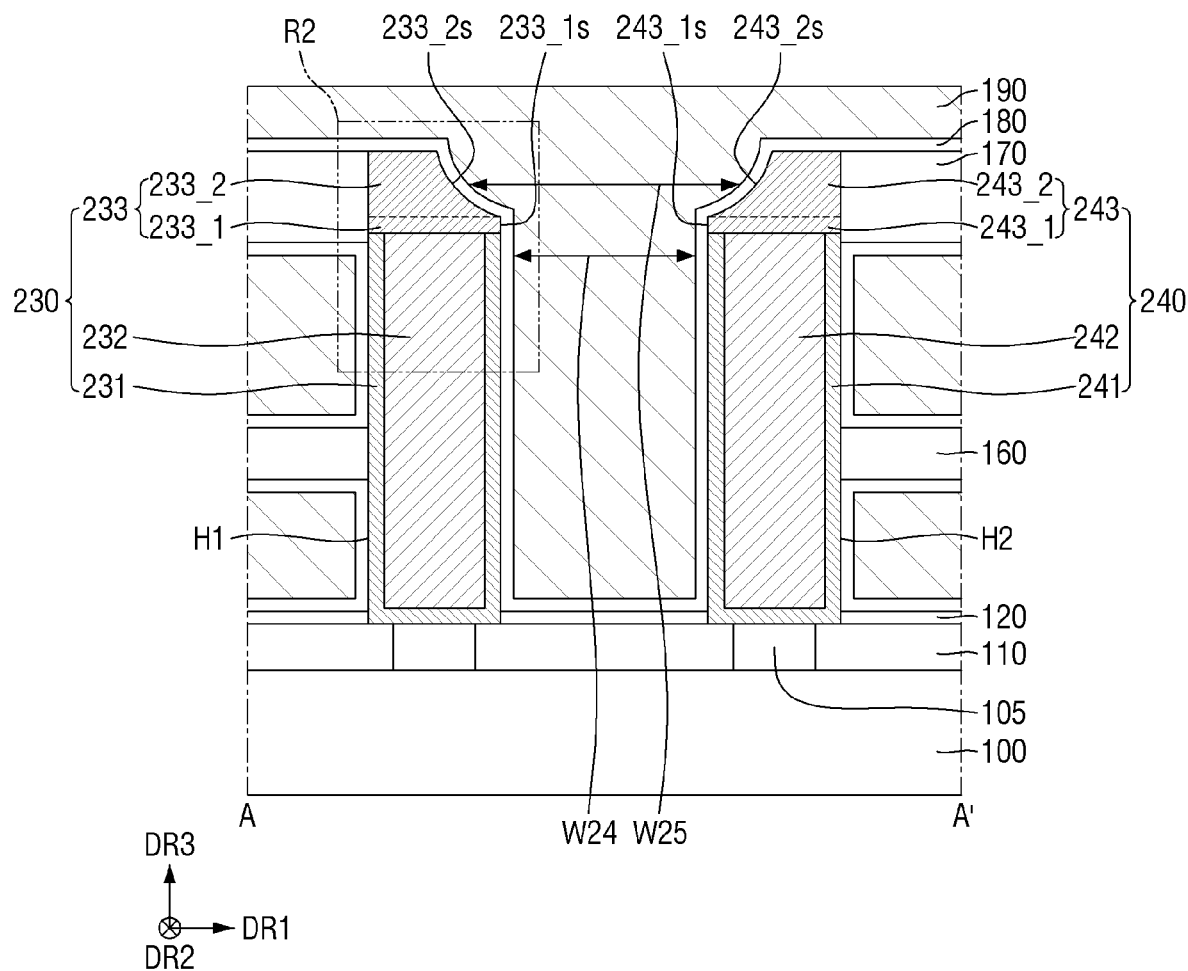
FIG. 17 is a cross-sectional view illustrating a semiconductor device according to some other embodiments of the present disclosure.

FIG. 17 is a cross-sectional view illustrating a semiconductor device according to some other embodiments of the present disclosure. FIG. 18 is an enlarged view illustrating a region R2 of FIG. 17.

Figure 18:
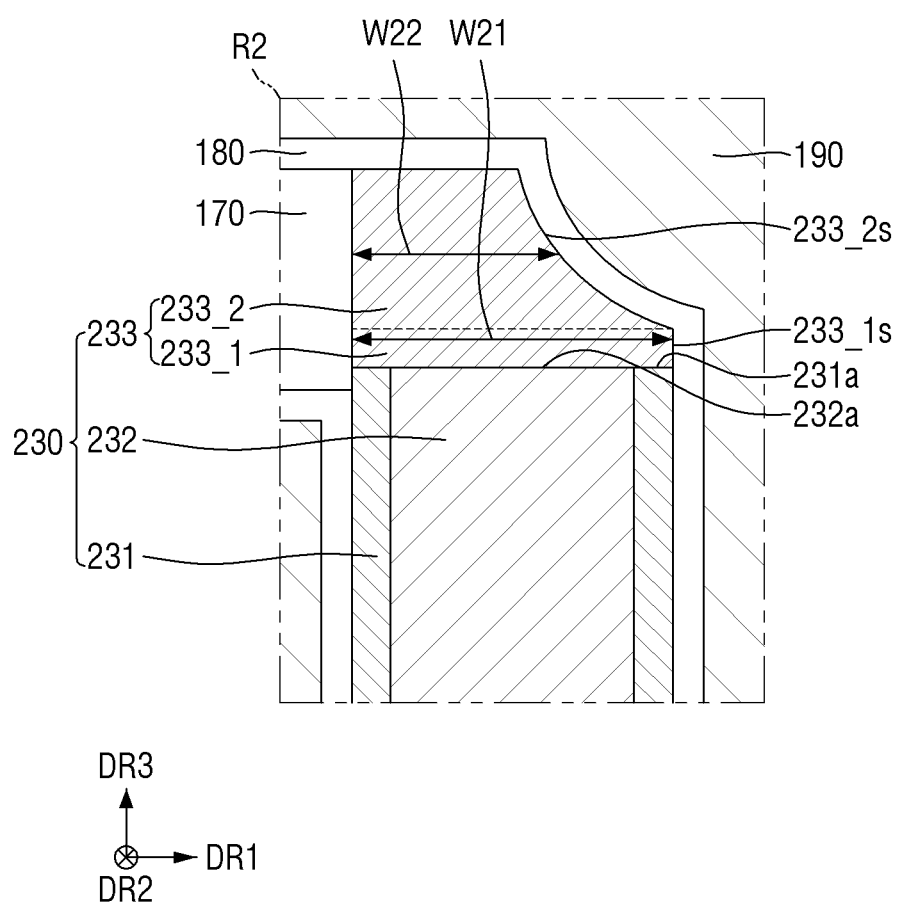
FIG. 18 is an enlarged view illustrating a region R2 of FIG. 17.

Referring to FIGS. 17 and 18, in the semiconductor device according to some other embodiments of the present disclosure, each of an upper surface 231a of a first layer 231 of a first lower electrode 230 and an upper surface 232a of a second layer 232 of the first lower electrode 230 may be formed between the lower surface of the second supporter pattern 170 and the upper surface of the second supporter pattern 170. In addition, each of an upper surface of a first layer 241 of a second lower electrode 240 and an upper surface of a second layer 242 of the second lower electrode 240 may be formed between the lower surface of the second supporter pattern 170 and the upper surface of the second supporter pattern 170.

A third layer 233 of the first lower electrode 230 may include a first portion 233_1 and a second portion 233_2. The first portion 233_1 of the third layer 233 of the first lower electrode 230 may be on the upper surface 231a of the first layer 231 of the first lower electrode 230 and the upper surface 232a of the second layer 232 of the first lower electrode 230. In an implementation, a width W21 of the first portion 233_1 of the third layer 233 of the first lower electrode 230 in the first horizontal direction DR1 may be the same as a width in the first horizontal direction DR1 between outer walls of the first layer 231 of the first lower electrode 230.

The second portion 233_2 of the third layer 233 of the first lower electrode 230 may be on the first portion 233_1 of the third layer 233 of the first lower electrode 230. In an implementation, a sidewall 233_2s of the second portion 233_2 of the third layer 233 of the first lower electrode 230 exposed to the open region (OR of FIG. 1) may be formed to be concave toward the second portion 233_2 of the third layer 233 of the first lower electrode 230. In an implementation, as the second portion 233_2 of the third layer 233 of the first lower electrode 230 becomes mare adjacent to the first portion 233_1 of the third layer 233 of the first lower electrode 230, a width W22 of the second portion 233_2 of the third layer 233 of the first lower electrode 230 in the first horizontal direction DR1 may increase continuously. In an implementation, the width W22 of the second portion 233_2 of the third layer 233 of the first lower electrode 230 in the first horizontal direction DR1 may be smaller than the width W21 of the first portion 233_1 of the third layer 233 of the first lower electrode 230 in the first horizontal direction DR1.

The third layer 243 of the second lower electrode 240 may include a first portion 243_1 and a second portion 243_2. The first portion 243_1 of the third layer 243 of the second lower electrode 240 may be on the upper surface of the first layer 241 of the second lower electrode 240 and the upper surface of the second layer 242 of the second lower electrode 240. In an implementation, a width of the first portion 243_1 of the third layer 243 of the second lower electrode 240 in the first horizontal direction DR1 may be the same as a width in the first horizontal direction DR1 between outer walls of the first layer 241 of the second lower electrode 240.

The second portion 243_2 of the third layer 243 of the second lower electrode 240 may be on the first portion 243_1 of the third layer 243 of the second lower electrode 240. In an implementation, a sidewall 243_2s of the second portion 243_2 of the third layer 243 of the second lower electrode 240 exposed to the open region (OR of FIG. 1) may be formed to be concave toward the second portion 243_2 of the third layer 243 of the second lower electrode 240. In an implementation, as the second portion 243_2 of the third layer 243 of the second lower electrode 240 becomes more adjacent to the first portion 243_1 of the third layer 243 of the second lower electrode 240, a width of the second portion 243_2 of the third layer 243 of the second lower electrode 240 in the first horizontal direction DR1 may increase continuously. In an implementation, the width of the second portion 243_2 of the third layer 243 of the second lower electrode 240 in the first horizontal direction DR1 may be smaller than the width of the first portion 243_1 of the third layer 243 of the second lower electrode 240 in the first horizontal direction DR1.

In an implementation, a width W25 of the upper electrode 190 in the first horizontal direction DR1 between the sidewall 233_2s of the second portion 233_2 of the third layer 233 of the first lower electrode 230 and the sidewall 243_2s of the second portion 243_2 of the third layer 243 of the second lower electrode 240 may be greater than a width W24 of the upper electrode 190 in the first horizontal direction DR1 between a sidewall 233_1s of the first portion 233_1 of the third layer 233 of the first lower electrode 230 and a sidewall 243_1s of the first portion 243_1 of the third layer 243 of the second lower electrode 240. In an implementation, the width W25 of the upper electrode 190 in the first horizontal direction DR1 between the sidewall 233_2s of the second portion 233_2 of the third layer 233 of the first lower electrode 230 and the sidewall 243_2s of the second portion 243_2 of the third layer 243 of the second lower electrode 240 may be continuously reduced as the upper electrode 190 becomes more adjacent to the substrate 100.

Hereinafter, a semiconductor device according to some other embodiments of the present disclosure will be described with reference to FIGS. 19 and 20. The following description will be based on differences from the semiconductor devices shown in FIGS. 1 to 4.

Figure 19:
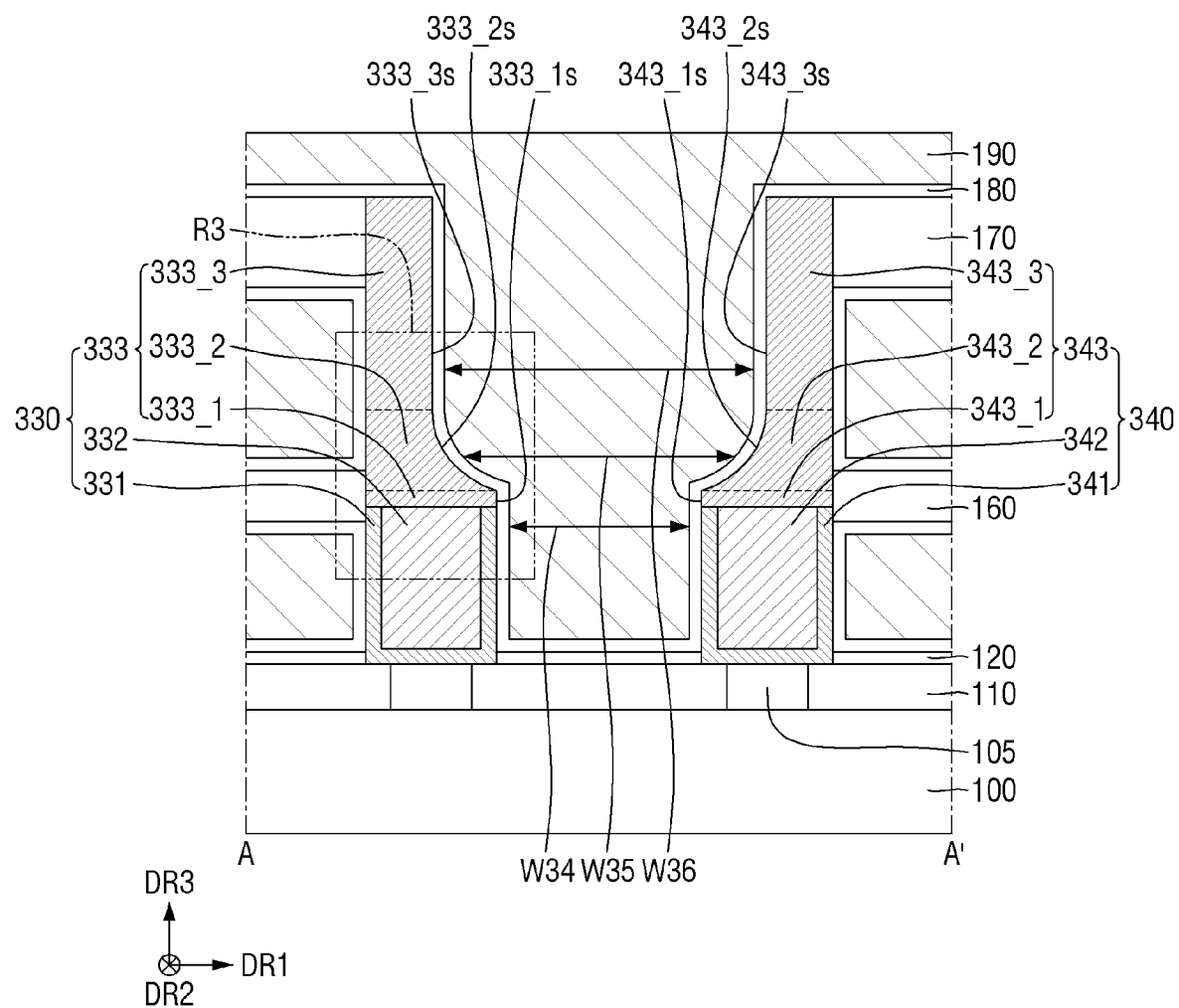
FIG. 19 is a cross-sectional view illustrating a semiconductor device according to some other embodiments of the present disclosure.

FIG. 19 is a cross-sectional view illustrating a semiconductor device according to some other embodiments of the present disclosure. FIG. 20 is an enlarged view illustrating a region R3 of FIG. 19.

Figure 20:
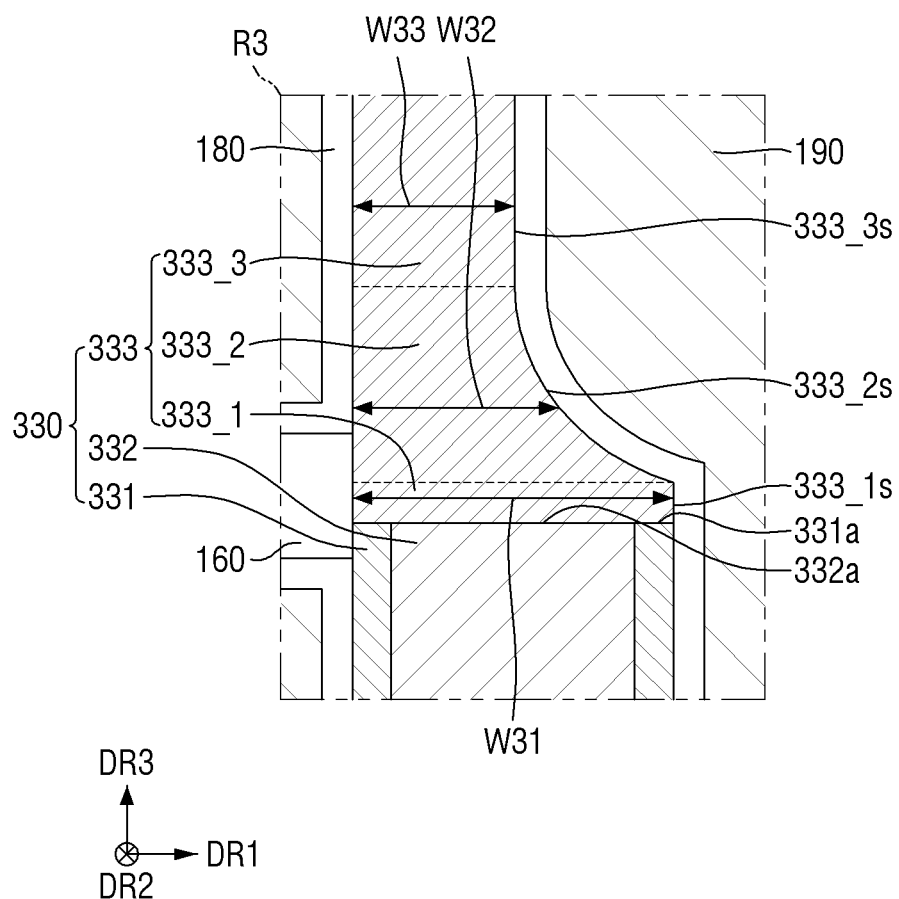
FIG. 20 is an enlarged view illustrating a region R3 of FIG. 19.

Referring to FIGS. 19 and 20, in the semiconductor device according to some other embodiments of the present disclosure, each of an upper surface 331a of a first layer 331 of a first lower electrode 330 and an upper surface 332a of a second layer 332 of the first lower electrode 330 may be formed between the lower surface of the first supporter pattern 160 and the upper surface of the first supporter pattern 160. In addition, each of an upper surface of a first layer 341 of a second lower electrode 340 and an upper surface of a second layer 342 of the second lower electrode 340 may be formed between the lower surface of the first supporter pattern 160 and the upper surface of the first supporter pattern 160.

A third layer 333 of the first lower electrode 330 may include a first portion 333_1, a second portion 333_2, and a third portion 333_3. The first portion 333_1 of the third layer 333 of the first lower electrode 330 may be on the upper surface 331a of the first layer 331 of the first lower electrode 330 and the upper surface 332a of the second layer 332 of the first lower electrode 330. In an implementation, a width W31 of the first portion 333_1 of the third layer 333 of the first lower electrode 330 in the first horizontal direction DR1 may be the same as a width in the first horizontal direction DR1 between outer walls of the first layer 331 of the first lower electrode 330.

The second portion 333_2 of the third layer 333 of the first lower electrode 330 may be on the first portion 333_1 of the third layer 333 of the first lower electrode 330. In an implementation, a sidewall 333_2s of the second portion 333_2 of the third layer 333 of the first lower electrode 330 exposed to the open region (OR of FIG. 1) may be formed to be concave toward the second portion 333_2 of the third layer 333 of the first lower electrode 330. In an implementation, as the second portion 333_2 of the third layer 333 of the first lower electrode 330 becomes adjacent to the first portion 333_1 of the third layer 333 of the first lower electrode 330, a width W32 of the second portion 333_2 of the third layer 333 of the first lower electrode 330 in the first horizontal direction DR1 may be increased continuously. In an implementation, the width W32 of the second portion 333_2 of the third layer 333 of the first lower electrode 330 in the first horizontal direction DR1 may be smaller than the width W31 of the first portion 333_1 of the third layer 333 of the first lower electrode 330 in the first horizontal direction DR1.

The third portion 333_3 of the third layer 333 of the first lower electrode 330 may be on the second portion 333_2 of the third layer 333 of the first lower electrode 330. In an implementation, a width W33 of the third portion 333_3 of the third layer 333 of the first lower electrode 330 in the first horizontal direction DR1 may be smaller than the width W32 of the second portion 333_2 of the third layer 333 of the first lower electrode 330 in the first horizontal direction DR1.

The third layer 343 of the second lower electrode 340 may include a first portion 343_1, a second portion 343_2, and a third portion 343_3. The first portion 343_1 of the third layer 343 of the second lower electrode 340 may be on the upper surface of the first layer 341 of the second lower electrode 340 and the upper surface of the second layer 342 of the second lower electrode 340. In an implementation, a width of the first portion 343_1 of the third layer 343 of the second lower electrode 340 in the first horizontal direction DR1 may be the same as a width in the first horizontal direction DR1 between outer walls of the first layer 341 of the second lower electrode 340.

The second portion 343_2 of the third layer 343 of the second lower electrode 340 may be on the first portion 343_1 of the third layer 343 of the second lower electrode 340. The second portion 343_2 of the third layer 343 of the second lower electrode 340 may be in contact with the sidewall of the first supporter pattern 160. In an implementation, a sidewall 343_2s of the second portion 343_2 of the third layer 343 of the second lower electrode 340 exposed to the open region (OR of FIG. 1) may be formed to be concave toward the second portion 343_2 of the third layer 343 of the second lower electrode 340. In an implementation, as the second portion 343_2 of the third layer 343 of the second lower electrode 340 becomes more adjacent to the first portion 343_1 of the third layer 343 of the second lower electrode 340, a width of the second portion 343_2 of the third layer 343 of the second lower electrode 340 in the first horizontal direction DR1 may increase continuously. In an implementation, the width of the second portion 343_2 of the third layer 343 of the second lower electrode 340 in the first horizontal direction DR1 may be smaller than the width of the first portion 343_1 of the third layer 343 of the second lower electrode 340 in the first horizontal direction DR1.

The third portion 343_3 of the third layer 343 of the second lower electrode 340 may be on the second portion 343_2 of the third layer 343 of the second lower electrode 340. In an implementation, a width of the third portion 343_3 of the third layer 343 of the second lower electrode 340 in the first horizontal direction DR1 may be smaller than the width of the second portion 343_2 of the third layer 343 of the second lower electrode 340 in the first horizontal direction DR1.

In an implementation, a width W36 of the upper electrode 190 in the first horizontal direction DR1 between a sidewall 333_3s of the third portion 333_3 of the third layer 333 of the first lower electrode 330 and a sidewall 343_3s of the third portion 343_3 of the third layer 343 of the second lower electrode 340 may be greater than a width W35 of the upper electrode 190 in the first horizontal direction DR1 between the sidewall 333_2s of the second portion 333_2 of the third layer 333 of the first lower electrode 330 and the sidewall 343_2s of the second portion 343_2 of the third layer 343 of the second lower electrode 340. In an implementation, the width W35 of the upper electrode 190 in the first horizontal direction DR1 between the sidewall 333_2s of the second portion 333_2 of the third layer 333 of the first lower electrode 330 and the sidewall 343_2s of the second portion 343_2 of the third layer 343 of the second lower electrode 340 may be continuously reduced as the upper electrode 190 becomes more adjacent to the substrate 100.

Also, the width W35 of the upper electrode 190 in the first horizontal direction DR1 between the sidewall 333_2s of the second portion 333_2 of the third layer 333 of the first lower electrode 330 and the sidewall 343_2s of the second portion 343_2 of the third layer 343 of the second lower electrode 340 may be greater than a width W34 of the upper electrode 190 in the first horizontal direction DR1 between a sidewall 333_1s of the first portion 333_1 of the third layer 333 of the first lower electrode 330 and a sidewall 343_1s of the first portion 343_1 of the third layer 343 of the second lower electrode 340.

Hereinafter, a semiconductor device according to some other embodiments of the present disclosure will be described with reference to FIGS. 21 and 22. The following description will be based on differences from the semiconductor devices shown in FIGS. 1 to 4.

Figure 21:
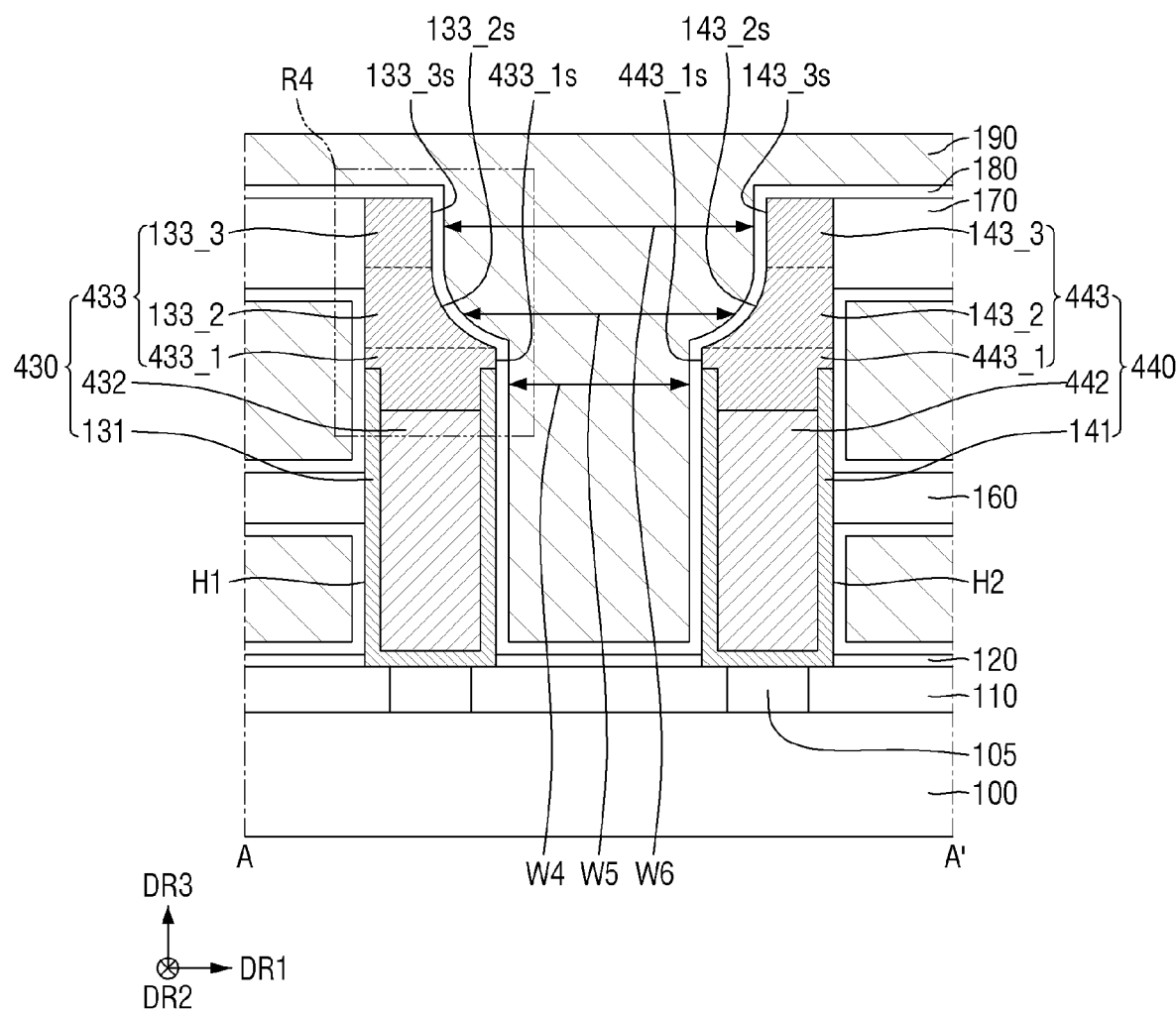
FIG. 21 is a cross-sectional view illustrating a semiconductor device according to some other embodiments of the present disclosure.

FIG. 21 is a cross-sectional view illustrating a semiconductor device according to some other embodiments of the present disclosure. FIG. 22 is an enlarged view illustrating a region R4 of FIG. 21.

Figure 22:
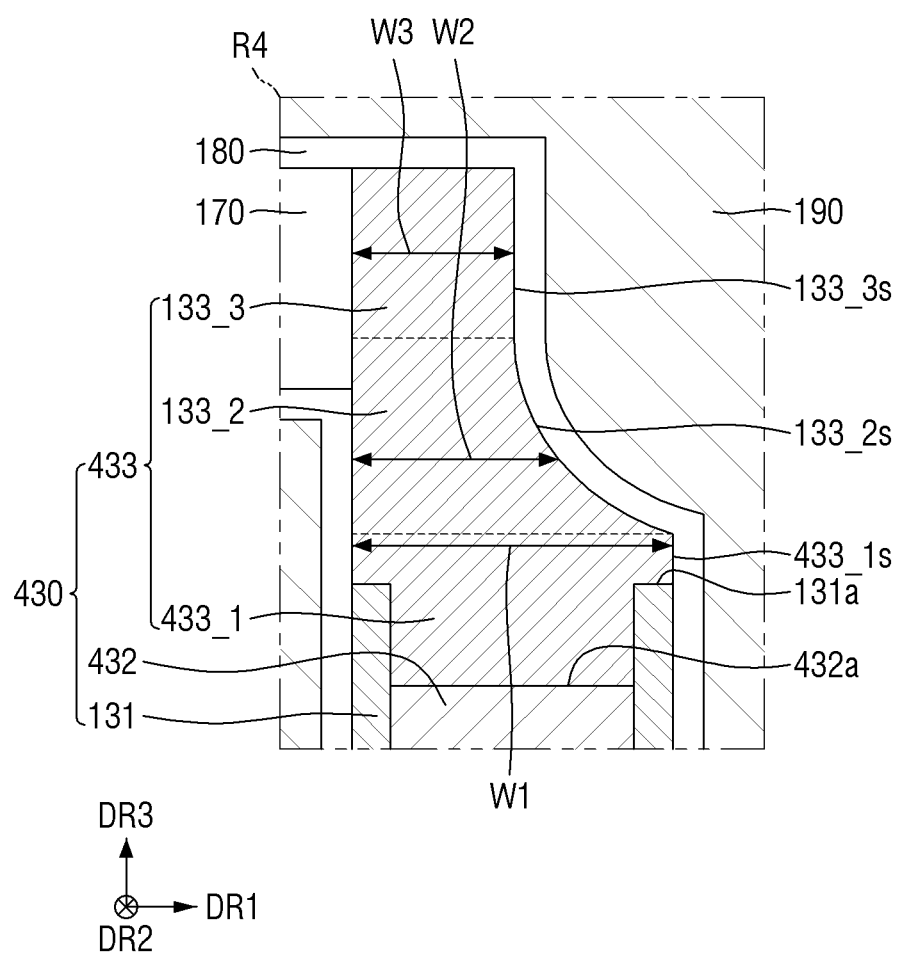
FIG. 22 is an enlarged view illustrating a region R4 of FIG. 21.

Referring to FIGS. 21 and 22, in the semiconductor device according to some other embodiments of the present disclosure, an upper surface 432a of a second layer 432 of a first lower electrode 430 may be formed to be lower than an upper surface 131a of a first layer 131 of the first lower electrode 430. In addition, an upper surface of a second layer 442 of a second lower electrode 440 may be formed to be lower than an upper surface of a first layer 141 of the second lower electrode 440.

At least a portion of a first portion 433_1 of a third layer 433 of the first lower electrode 430 may be between the first layers 131 of the first lower electrode 430. A sidewall 433_1s of the first portion 433_1 of the third layer 433 of the first lower electrode 430 may have the same slope profile as that of an outer wall of the first layer 131 of the first lower electrode 430. In addition, at least a portion of the first portion 443_1 of the third layer 443 of the second lower electrode 440 may be between the first layers 141 of the second lower electrode 440. A sidewall 443_1s of the first portion 443_1 of the third layer 443 of the second lower electrode 440 may have the same slope profile as that of an outer wall of the first layer 141 of the second lower electrode 440.

Hereinafter, a semiconductor device according to some other embodiments of the present disclosure will be described with reference to FIGS. 23 and 24. The following description will be based on differences from the semiconductor devices shown in FIGS. 1 to 4.

Figure 23:
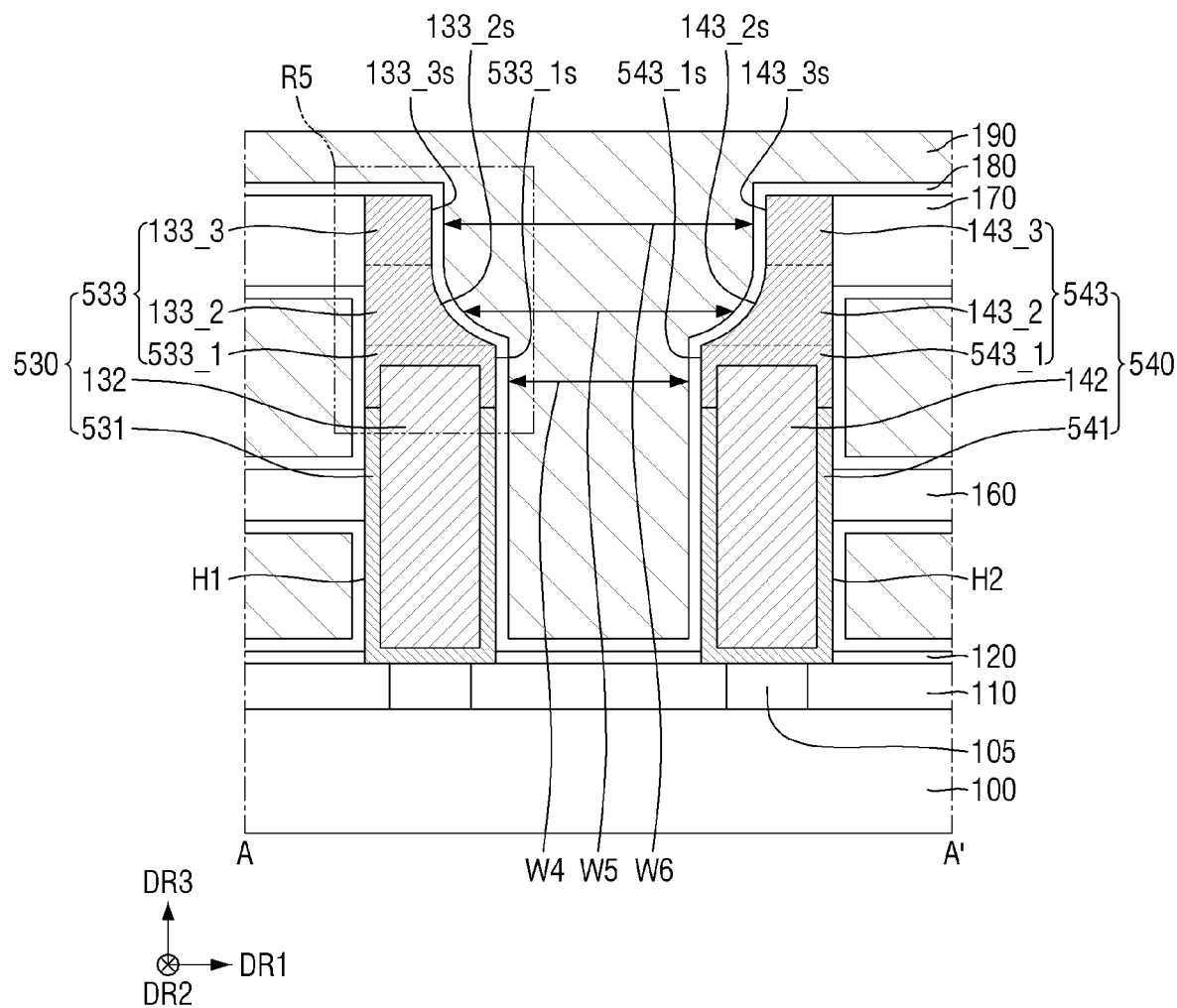
FIG. 23 is a cross-sectional view illustrating a semiconductor device according to some other embodiments of the present disclosure.

FIG. 23 is a cross-sectional view illustrating a semiconductor device according to some other embodiments of the present disclosure. FIG. 24 is an enlarged view illustrating a region R5 of FIG. 23.

Figure 24:
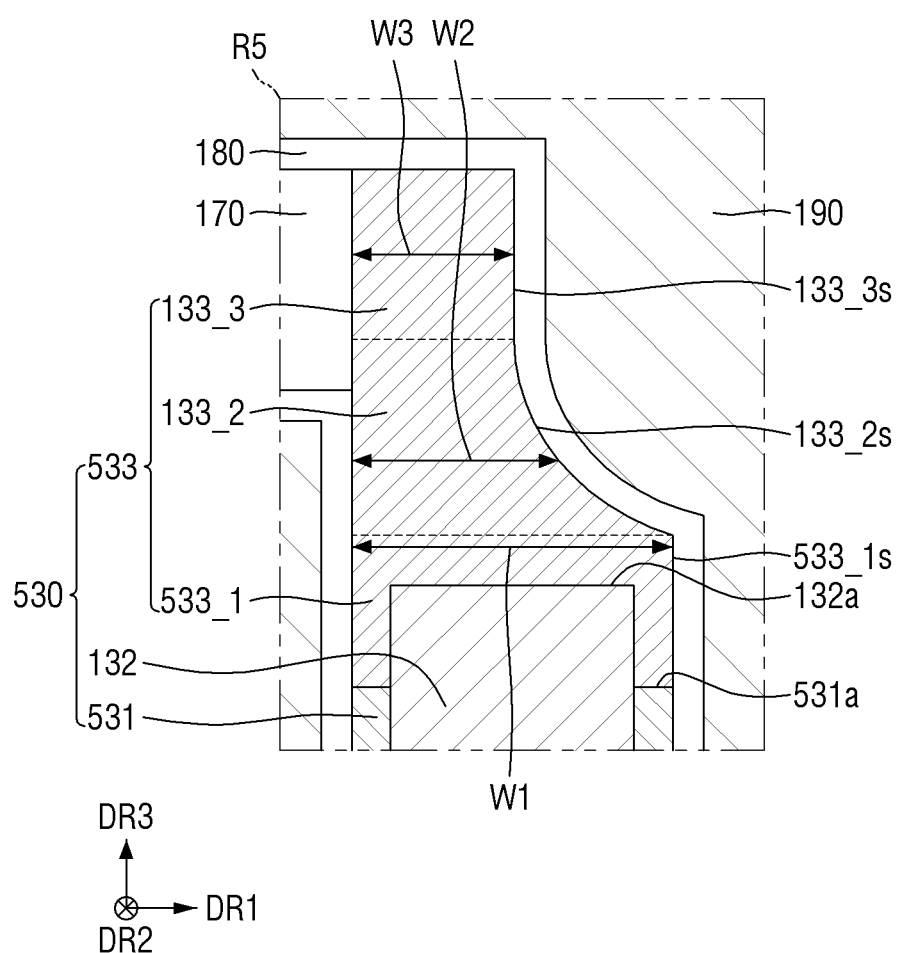
FIG. 24 is an enlarged view illustrating a region R5 of FIG. 23.

Referring to FIGS. 23 and 24, in the semiconductor device according to some other embodiments of the present disclosure, an upper surface 132a of a second layer 132 of a first lower electrode 530 may be formed to be lower than an upper surface 531a of a first layer 531 of the first lower electrode 530. In addition, an upper surface of a second layer 142 of a second lower electrode 540 may be formed to be lower than an upper surface of a first layer 541 of the second lower electrode 540.

At least a portion of a first portion 533_1 of a third layer 533 of the first lower electrode 530 may surround a sidewall of the second layer 132 on the upper surface 531a of the first layer 531 of the first lower electrode 530. A sidewall 533_1s of the first portion 533_1 of the third layer 533 of the first lower electrode 530 may have the same slope profile as that of an outer wall of the first layer 531 of the first lower electrode 530. In addition, at least a portion of a first portion 543_1 of the third layer 543 of the second lower electrode 540 may surround a sidewall of the second layer 142 of the second lower electrode 540 on the upper surface of the first layer 541 of the second lower electrode 540. A sidewall 543_1s of the first portion 543_1 of the third layer 543 of the second lower electrode 540 may have the same slope profile as that of an outer wall of the first layer 541 of the second lower electrode 540.

Hereinafter, a semiconductor device according to some other embodiments of the present disclosure will be described with reference to FIGS. 25 and 26. The following description will be based on differences from the semiconductor devices shown in FIGS. 1 to 4.

Figure 25:
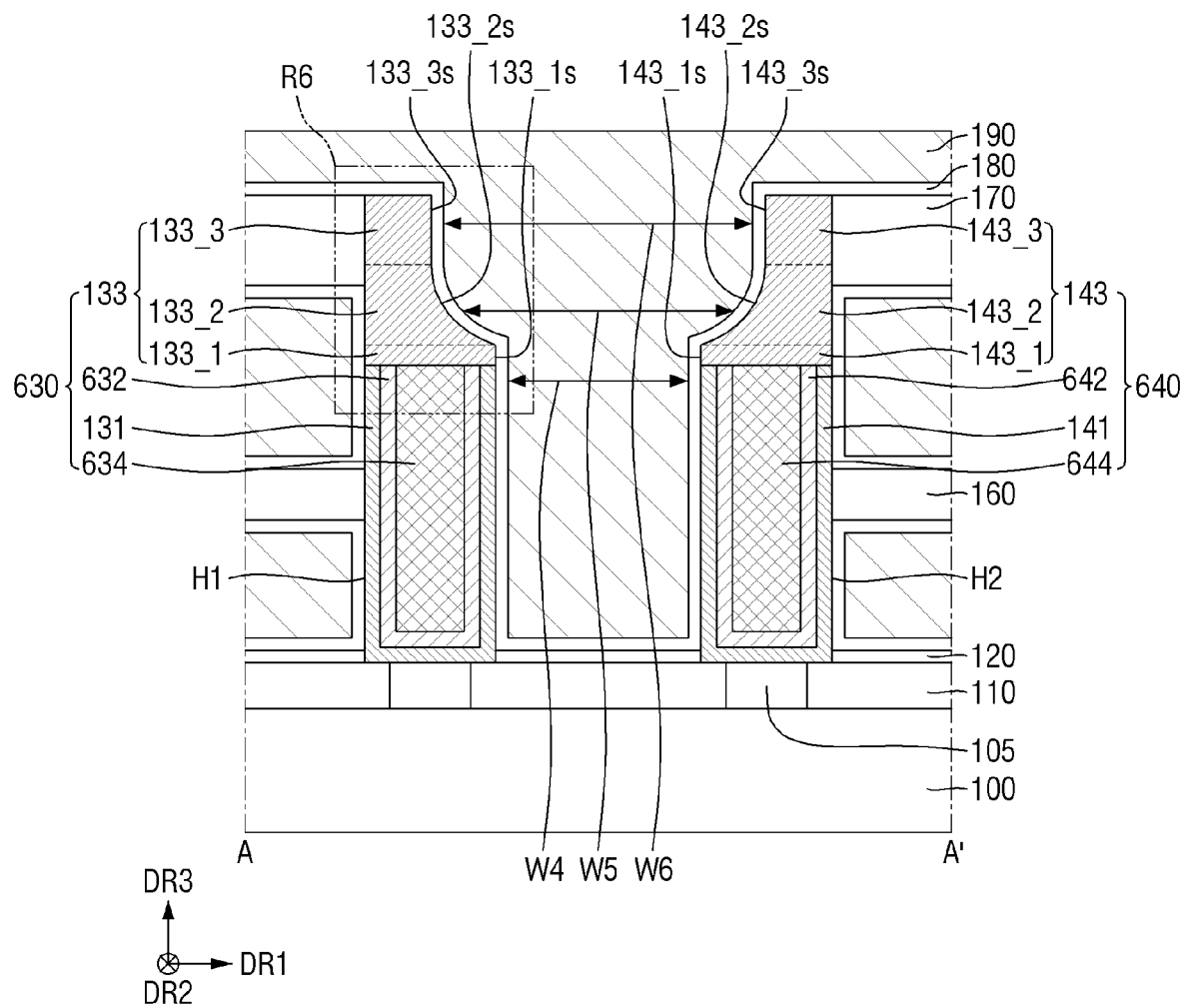
FIG. 25 is a cross-sectional view illustrating a semiconductor device according to some other embodiments of the present disclosure.

FIG. 25 is a cross-sectional view illustrating a semiconductor device according to some other embodiments of the present disclosure. FIG. 26 is an enlarged view illustrating a region R6 of FIG. 25.

Figure 26:
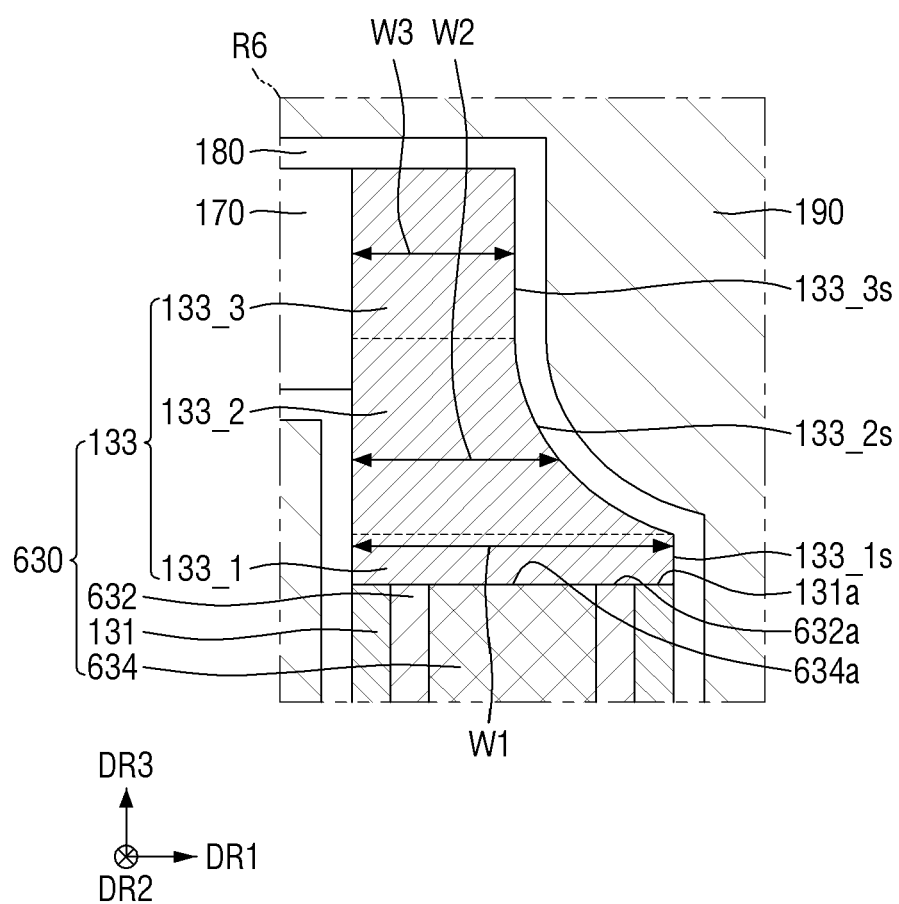
FIG. 26 is an enlarged view illustrating a region R6 of FIG. 25.

Referring to FIGS. 25 and 26, in the semiconductor device according to some other embodiments of the present disclosure, a first lower electrode 630 may include a first layer 131, a second layer 632, a third layer 133, and a fourth layer 634. Also, a second lower electrode 640 may include a first layer 141, a second layer 642, a third layer 143, and a fourth layer 644.

The second layer 632 of the first lower electrode 630 may be between the first layers 131 of the first lower electrode 630. The second layer 632 of the first lower electrode 630 may be along an inner surface of the first layer 131 of the first lower electrode 630. In an implementation, the second layer 632 of the first lower electrode 630 may be conformal. The fourth layer 634 of the first lower electrode 630 may be between the second layers 632 of the first lower electrode 630.

Each of an upper surface 131a of the first layer 131 of the first lower electrode 630, an upper surface 632a of the second layer 632 of the first lower electrode 630, and an upper surface 634a of the fourth layer 634 of the first lower electrode 630 may be in contact with the third layer 133 of the first lower electrode 630. In an implementation, the upper surface 131a of the first layer 131 of the first lower electrode 630, the upper surface 632a of the second layer 632 of the first lower electrode 630, and the upper surface 634a of the fourth layer 634 of the first lower electrode 630 may be formed on the same plane.

The second layer 642 of the second lower electrode 640 may be between the first layers 141 of the second lower electrode 640. The second layer 642 of the second lower electrode 640 may be disposed along an inner surface of the first layer 141 of the second lower electrode 640. In an implementation, the second layer 642 of the second lower electrode 640 may be conformal. The fourth layer 644 of the second lower electrode 640 may be between the second layers 642 of the second lower electrode 640.

Each of an upper surface of the first layer 141 of the second lower electrode 640, an upper surface of the second layer 642 of the second lower electrode 640, and an upper surface of the fourth layer 644 of the second lower electrode 640 may be in contact with the third layer 143 of the second lower electrode 640. In an implementation, the upper surface of the first layer 141 of the second lower electrode 640, the upper surface of the second layer 642 of the second lower electrode 640, and the upper surface of the fourth layer 644 of the second lower electrode 640 may be formed on the same plane.

In an implementation, each of the second layer 632 of the first lower electrode 630, the second layer 642 of the second lower electrode 640, the fourth layer 634 of the first lower electrode 630, and the fourth layer 644 of the second lower electrode 640 may include titanium silicon nitride (TiSiN). An atomic ratio of silicon (Si) included in each of the second layer 632 of the first lower electrode 630 and the second layer 642 of the second lower electrode 640 may differ from an atomic ratio of silicon (Si) included in each of the fourth layer 634 of the first lower electrode 630 and the fourth layer 644 of the second lower electrode 640. In an implementation, the atomic ratio of silicon (Si) included in each of the second layer 632 of the first lower electrode 630 and the second layer 642 of the second lower electrode 640 may be smaller than the atomic ratio of silicon (Si) included in each of the fourth layer 634 of the first lower electrode 630 and the fourth layer 644 of the second lower electrode 640, but the present disclosure is not limited thereto.

Hereinafter, a semiconductor device according to some other embodiments of the present disclosure will be described with reference to FIGS. 27 and 28. The following description will be based on differences from the semiconductor devices shown in FIGS. 1 to 4.

Figure 27:
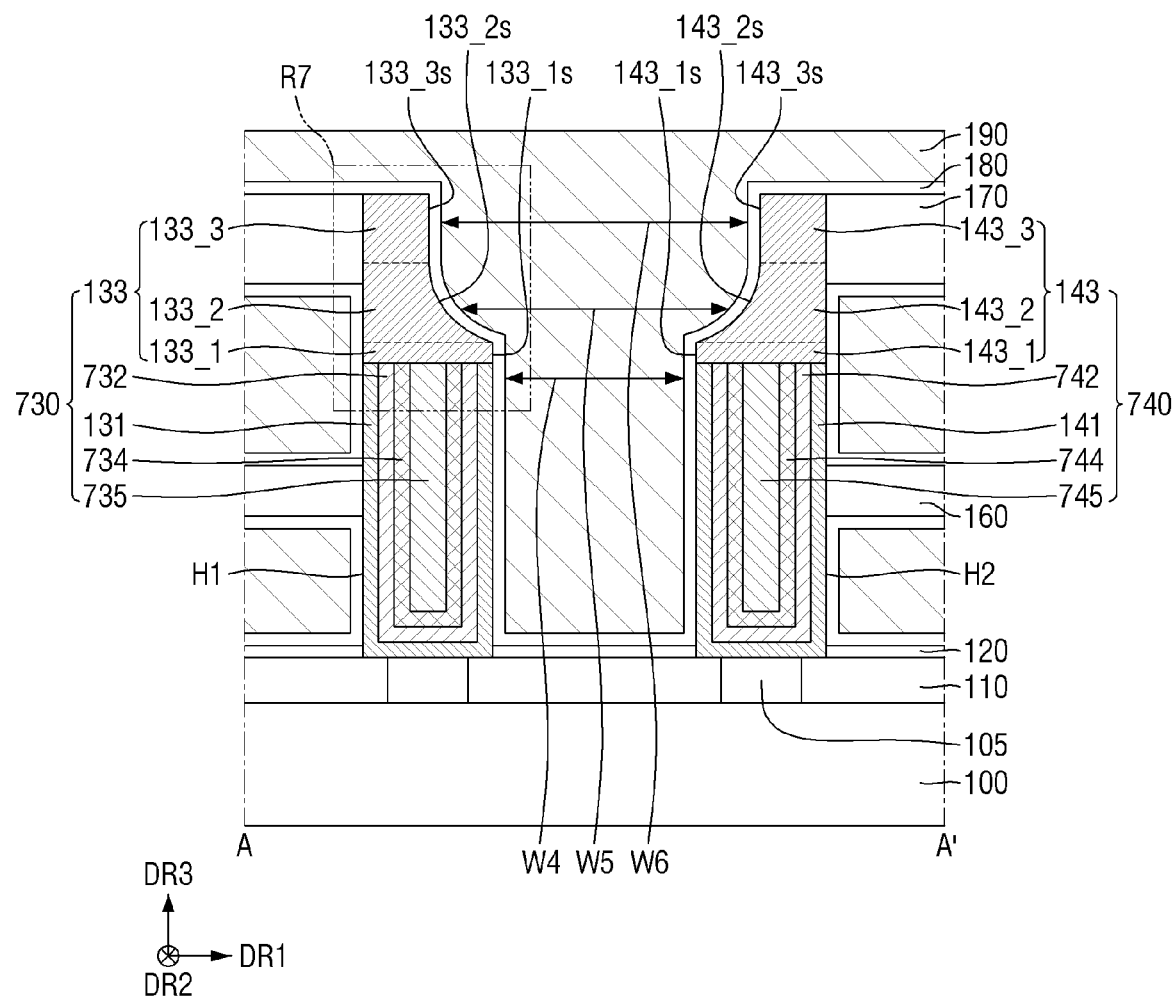
FIG. 27 is a cross-sectional view illustrating a semiconductor device according to some other embodiments of the present disclosure.

FIG. 27 is a cross-sectional view illustrating a semiconductor device according to some other embodiments of the present disclosure. FIG. 28 is an enlarged view illustrating a region R7 of FIG. 27.

Figure 28:
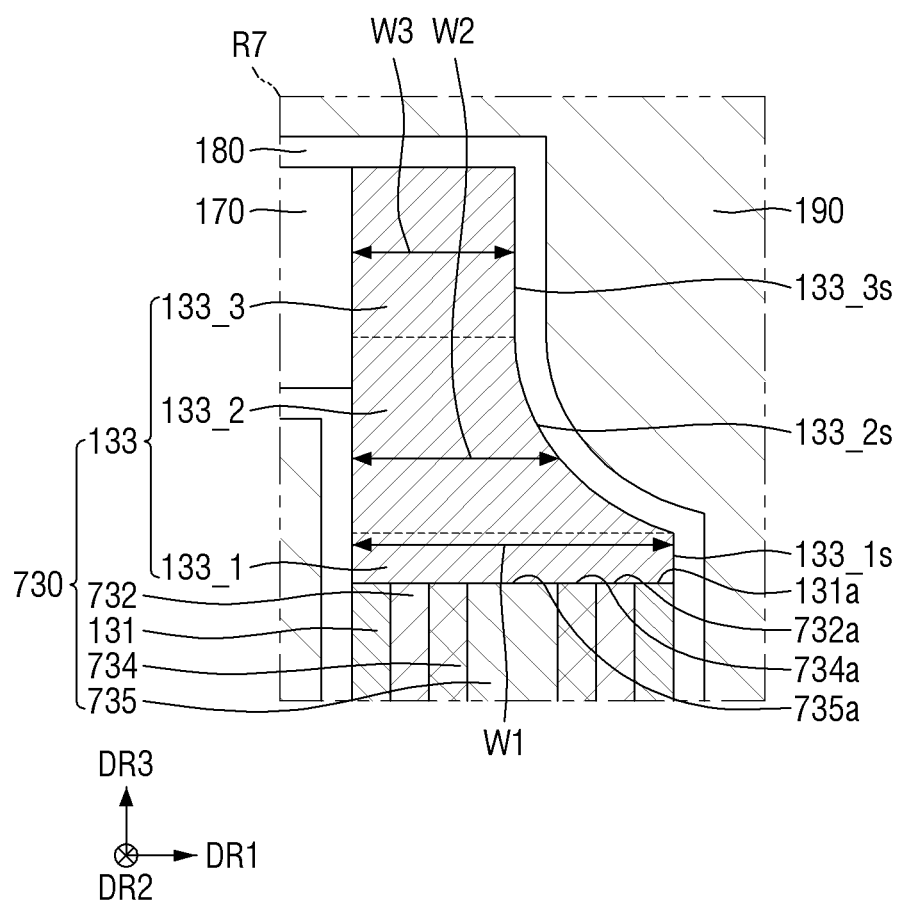
FIG. 28 is an enlarged view illustrating a region R7 of FIG. 25.

Referring to FIGS. 27 and 28, in the semiconductor device according to some other embodiments of the present disclosure, a first lower electrode 730 may include a first layer 131, a second layer 732, a third layer 133, a fourth layer 734, and a fifth layer 735. Also, a second lower electrode 740 may include a first layer 141, a second layer 742, a third layer 143, a fourth layer 744, and a fifth layer 745.

The second layer 732 of the first lower electrode 730 may be between the first layers 131 of the first lower electrode 730. The second layer 732 of the first lower electrode 730 may be disposed along an inner surface of the first layer 131 of the first lower electrode 730. In an implementation, the second layer 732 of the first lower electrode 730 may be conformal. The fourth layer 734 of the first lower electrode 730 may be between the second layers 732 of the first lower electrode 730. The fourth layer 734 of the first lower electrode 730 may be disposed along an inner surface of the second layer 732 of the first lower electrode 730. In an implementation, the fourth layer 734 of the first lower electrode 730 may be conformal. The fifth layer 735 of the first lower electrode 730 may be between the fourth layers 734 of the first lower electrode 730.

Each of an upper surface 131a of the first layer 131 of the first lower electrode 730, an upper surface 732a of the second layer 732 of the first lower electrode 730, an upper surface 734a of the fourth layer 734 of the first lower electrode 730, and an upper surface 735a of the fifth layer 735 of the first lower electrode 730 may be in contact with the third layer 133 of the first lower electrode 730. In an implementation, the upper surface 131a of the first layer 131 of the first lower electrode 730, the upper surface 732a of the second layer 732 of the first lower electrode 730, the upper surface 734a of the fourth layer 734 of the first lower electrode 730, and the upper surface 735a of the fifth layer 735 of the first lower electrode 730 may be formed on the same plane.

The second layer 742 of the second lower electrode 740 may be between the first layers 141 of the second lower electrode 740. The second layer 742 of the second lower electrode 740 may be disposed along an inner surface of the first layer 141 of the second lower electrode 740. In an implementation, the second layer 742 of the second lower electrode 740 may be conformal. The fourth layer 744 of the second lower electrode 740 may be between the second layers 742 of the second lower electrode 740. The fourth layer 744 of the second lower electrode 740 may be disposed along an inner surface of the second layer 742 of the second lower electrode 740. In an implementation, the fourth layer 744 of the second lower electrode 740 may be conformal. The fifth layer 745 of the second lower electrode 740 may be between the fourth layers 744 of the second lower electrode 740.

An upper surface of the first layer 141 of the second lower electrode 740, an upper surface of the second layer 742 of the second lower electrode 740, an upper surface of the fourth layer 744 of the second lower electrode 740, and an upper surface of the fifth layer 745 of the second lower electrode 740 may be in contact with the third layer 143 of the second lower electrode 740. In an implementation, the upper surface of the first layer 141 of the second lower electrode 740, the upper surface of the second layer 742 of the second lower electrode 740, the upper surface of the fourth layer 744 of the second lower electrode 740, and the upper surface of the fifth layer 745 of the second lower electrode 740 may be formed on the same plane.

In an implementation, the first layer 131 of the first lower electrode 730, the second layer 732 of the first lower electrode 730, the fourth layer 734 of the first lower electrode 730, and the fifth layer 735 of the first lower electrode 730 may include their respective materials different from one another. In an implementation, the first layer 141 of the second lower electrode 740, the second layer 742 of the second lower electrode 740, the fourth layer 744 of the second lower electrode 740, and the fifth layer 745 of the second lower electrode 740 may include their respective materials different from one another.

In an implementation, each of the first layer 131 of the first lower electrode 730 and the first layer 141 of the second lower electrode 740 may include titanium nitride (TiN). In an implementation, each of the second layer 732 of the first lower electrode 730 and the second layer 742 of the second lower electrode 740 may include tungsten (W). In an implementation, each of the fourth layer 734 of the first lower electrode 730 and the fourth layer 744 of the second lower electrode 740 may include copper (Cu) or titanium silicon nitride (TiSiN). In an implementation, each of the fifth layer 735 of the first lower electrode 730 and the fifth layer 745 of the second lower electrode 740 may include polysilicon.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate;
a first supporter pattern spaced apart from the substrate in a vertical direction;
a second supporter pattern spaced apart from the first supporter pattern in the vertical direction;
a lower electrode hole extended in the vertical direction on the substrate; and
a lower electrode inside the lower electrode hole, the lower electrode being in contact with each of a sidewall of the first supporter pattern and a sidewall of the second supporter pattern, the lower electrode including a first layer disposed along a portion of a sidewall and a bottom surface of the lower electrode hole, a second layer between portions of the first layer, and a third layer on an upper surface of each of the first and second layers,
wherein each of the first layer and the third layer includes a material different from the second layer, and
wherein a sidewall of at least a portion of the third layer is concave toward the third layer, overlaps the second layer in the vertical direction, and is spaced apart from the second layer in the vertical direction.

2. The semiconductor device as claimed in claim 1, wherein a width of the at least the portion of the third layer in a horizontal direction increases continuously as the third layer becomes closer to the second layer.

3. The semiconductor device as claimed in claim 1, wherein each of the upper surface of the first layer and the upper surface of the second layer is between the first supporter pattern and the second supporter pattern.

4. The semiconductor device as claimed in claim 1, wherein each of the upper surface of the first layer and the upper surface of the second layer is between a lower surface of the second supporter pattern and an upper surface of the second supporter pattern.

5. The semiconductor device as claimed in claim 1, wherein each of the upper surface of the first layer and the upper surface of the second layer is between a lower surface of the first supporter pattern and an upper surface of the first supporter pattern.

6. The semiconductor device as claimed in claim 1, wherein the upper surface of the first layer and the upper surface of the second layer are on the same plane.

7. The semiconductor device as claimed in claim 1, wherein the upper surface of the second layer is lower than the upper surface of the first layer.

8. The semiconductor device as claimed in claim 1, wherein the upper surface of the second layer is higher than the upper surface of the first layer.

9. The semiconductor device as claimed in claim 1, wherein the first layer and the third layer include the same material.

10. The semiconductor device as claimed in claim 1, wherein the lower electrode further includes a fourth layer between portions of the second layer below the third layer.

11. The semiconductor device as claimed in claim 10, wherein the lower electrode further includes a fifth layer between portions of the fourth layer below the third layer.

12. A semiconductor device, comprising:
a substrate;
a first supporter pattern spaced apart from the substrate in a vertical direction;
a second supporter pattern spaced apart from the first supporter pattern in the vertical direction;
a lower electrode hole extended in the vertical direction on the substrate;
a lower electrode inside the lower electrode hole, the lower electrode being in contact with each of a sidewall of the first supporter pattern and a sidewall of the second supporter pattern, the lower electrode including a first layer disposed along a portion of a sidewall and a bottom surface of the lower electrode hole, a second layer between portions of the first layer, and a third layer on an upper surface of each of the first and second layers,
wherein each of the first layer and the third layer includes a material different from the second layer, and wherein the third layer includes:
- a first portion in contact with each of the upper surface of the first layer and the upper surface of the second layer, a width in a horizontal direction of the first portion being the same as a width in the horizontal direction between outer walls of the first layer; and
- a second portion on the first portion and spaced apart from each of the upper surface of the first layer and the upper surface of the second layer in the vertical direction, a width in the horizontal direction of the second portion continuously increasing as it becomes closer to the first portion.

13. The semiconductor device as claimed in claim 12, wherein a sidewall of the second portion is concave toward the second portion, overlaps the second layer in the vertical direction, and is spaced apart from the second layer in the vertical direction.

14. The semiconductor device as claimed in claim 12, wherein each of the upper surface of the first layer and the upper surface of the second layer is between the first supporter pattern and the second supporter pattern.

15. The semiconductor device as claimed in claim 12, wherein the upper surface of the first layer and the upper surface of the second layer are on the same plane.

16. The semiconductor device as claimed in claim 12, wherein the first layer and the third layer include materials different from each other.

17. A semiconductor device, comprising:
- a substrate;
- a first supporter pattern spaced apart from the substrate in a vertical direction;
- a second supporter pattern spaced apart from the first supporter pattern in the vertical direction;
- a first lower electrode hole extended in the vertical direction on the substrate;
- a second lower electrode hole extended in the vertical direction on the substrate and spaced apart from the first lower electrode hole in a horizontal direction;
- an open region passing through each of the first and second supporter patterns in the vertical direction between the first lower electrode hole and the second lower electrode hole;
- a first lower electrode inside the first lower electrode hole, being in contact with each of a sidewall of the first supporter pattern and a sidewall of the second supporter pattern, the first lower electrode including a first layer disposed along a portion of a sidewall and a bottom surface of the first lower electrode hole, a second layer between portions of the first layer, and a third layer on an upper surface of each of the first and second layers;
- a second lower electrode inside the second lower electrode hole; and
- an upper electrode at least partially overlapped with the second layer in the vertical direction inside the open region, wherein each of the first layer and the third layer includes a material different from the second layer, and wherein a lower surface of at least a portion of the upper electrode overlapped with the second layer in the vertical direction is higher than the upper surface of the second layer.

18. The semiconductor device as claimed in claim 17, wherein the third layer includes:
- a first portion in contact with each of the upper surface of the first layer and the upper surface of the second layer, a width in a horizontal direction of the first portion being the same as a width in the horizontal direction between outer walls of the first layer; and
- a second portion on the first portion and spaced apart from each of the upper surface of the first layer and the upper surface of the second layer in the vertical direction, a width in the horizontal direction of the second portion continuously increasing as it becomes closer to the first portion.

19. The semiconductor device as claimed in claim 18, wherein a sidewall of the second portion is concave toward the second portion, and overlaps the second layer in the vertical direction.

20. The semiconductor device as claimed in claim 18, wherein a width of the upper electrode in the horizontal direction is continuously reduced between a sidewall of the second portion and the second lower electrode as it becomes closer to the substrate.

* * * * *